United States Patent
Go et al.

(10) Patent No.: US 11,006,514 B2
(45) Date of Patent: May 11, 2021

(54) THREE-DIMENSIONAL DECOUPLING INTEGRATION WITHIN HOLE IN MOTHERBOARD

(71) Applicant: Intel Corporation, Santa Clara, CA (US)

(72) Inventors: Jia Yan Go, Kulim (MY); Min Suet Lim, Bayan Lepas (MY); Tin Poay Chuah, Bayan Lepas (MY); Seok Ling Lim, Kulim (MY); Howe Yin Loo, Sungai Petani (MY)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/481,043

(22) PCT Filed: Mar. 30, 2017

(86) PCT No.: PCT/US2017/025152
§ 371 (c)(1),
(2) Date: Jul. 25, 2019

(87) PCT Pub. No.: WO2018/182643
PCT Pub. Date: Oct. 4, 2018

(65) Prior Publication Data
US 2019/0394871 A1    Dec. 26, 2019

(51) Int. Cl.
*H01L 23/552*        (2006.01)
*H05K 1/02*          (2006.01)
(Continued)

(52) U.S. Cl.
CPC ......... *H05K 1/0216* (2013.01); *H01L 21/50* (2013.01); *H01L 23/49811* (2013.01);
(Continued)

(58) Field of Classification Search
CPC ......... H01L 23/49811; H01L 23/49816; H01L 23/552; H01L 23/642; H01L 23/66;
(Continued)

(56) References Cited

U.S. PATENT DOCUMENTS

| 7,109,410 | B2 | 9/2006 | Arnold et al. | |
| 7,348,213 | B2 * | 3/2008 | Komatsu | H01L 21/486 |
| | | | | 438/106 |
| 8,035,216 | B2 | 10/2011 | Skeete | |
| 8,743,554 | B2 * | 6/2014 | Russell | H05K 1/185 |
| | | | | 361/761 |

(Continued)

OTHER PUBLICATIONS

International Search Report and Written Opinion for International Patent Application No. PCT/US2017/025152 dated Dec. 27, 2017, 8 pgs.
(Continued)

*Primary Examiner* — Stephen W Smoot
(74) *Attorney, Agent, or Firm* — Schwabe, Williamson & Wyatt, P.C.

(57) ABSTRACT

Semiconductor packages and a method of forming a semiconductor package are described. The semiconductor package has a foundation layer mounted on a motherboard. The semiconductor package also includes a hole in motherboard (HiMB) that is formed in the motherboard. The semiconductor package has one or more capacitors mounted on an electrical shield. The electrical shield may be embedded in the HiMB of the motherboard. Accordingly, the semiconductor package has capacitors vertically embedded between the electrical shield and the HiMB of the motherboard. The semiconductor package may also have one or more HiMB sidewalls formed on the HiMB, where each of the one or more HiMB sidewalls includes at least one or more plated through holes (PTHs) with an exposed layer. The PTHs may be electrically coupled to the capacitors as the capacitors are vertically embedded between the electrical shield sidewalls and the HiMB sidewalls (i.e., three-dimensional (3D) capacitors).

25 Claims, 17 Drawing Sheets

(51) Int. Cl.
*H01L 21/50* (2006.01)
*H01L 23/498* (2006.01)
*H01L 25/16* (2006.01)
*H05K 1/11* (2006.01)
*H05K 1/18* (2006.01)
*H05K 3/30* (2006.01)
*H01L 49/02* (2006.01)
*H01L 23/64* (2006.01)

(52) U.S. Cl.
CPC .......... *H01L 23/552* (2013.01); *H01L 23/642* (2013.01); *H01L 25/16* (2013.01); *H01L 25/162* (2013.01); *H01L 28/40* (2013.01); *H05K 1/0237* (2013.01); *H05K 1/111* (2013.01); *H05K 1/185* (2013.01); *H05K 3/306* (2013.01); *H05K 2201/10015* (2013.01)

(58) Field of Classification Search
CPC .......... H01L 24/16; H01L 2224/16225; H01L 2924/15151; H01L 25/16; H01L 25/162; H01L 28/40; H05K 1/0216; H05K 1/02131; H05K 1/0237; H05K 1/111; H05K 1/183; H05K 1/184; H05K 1/185; H05K 3/306; H05K 2201/10015
See application file for complete search history.

(56) References Cited

U.S. PATENT DOCUMENTS

| | | | |
|---|---|---|---|
| 9,030,841 B2 | 5/2015 | Arnold et al. | |
| 2004/0183193 A1* | 9/2004 | Koide | H05K 1/141 257/734 |
| 2005/0273208 A1* | 12/2005 | Yazawa | G01K 7/425 700/299 |
| 2006/0118931 A1* | 6/2006 | Ho | H05K 1/185 257/678 |
| 2006/0231947 A1 | 10/2006 | Hosomi et al. | |
| 2013/0048361 A1* | 2/2013 | Yamashita | H01L 23/49822 174/260 |
| 2013/0285254 A1* | 10/2013 | Kainuma | H01L 23/49822 257/774 |
| 2015/0243609 A1* | 8/2015 | Lamorey | H01L 25/165 361/717 |
| 2015/0305210 A1 | 10/2015 | Yu et al. | |
| 2017/0181288 A1* | 6/2017 | Fujii | H01G 4/232 |
| 2018/0270957 A1* | 9/2018 | Swaminathan | H05K 3/303 |

OTHER PUBLICATIONS

International Preliminary Report on Patentability for International Patent Application No. PCT/US2017/025152 dated Oct. 10, 2019, 7 pages.

* cited by examiner

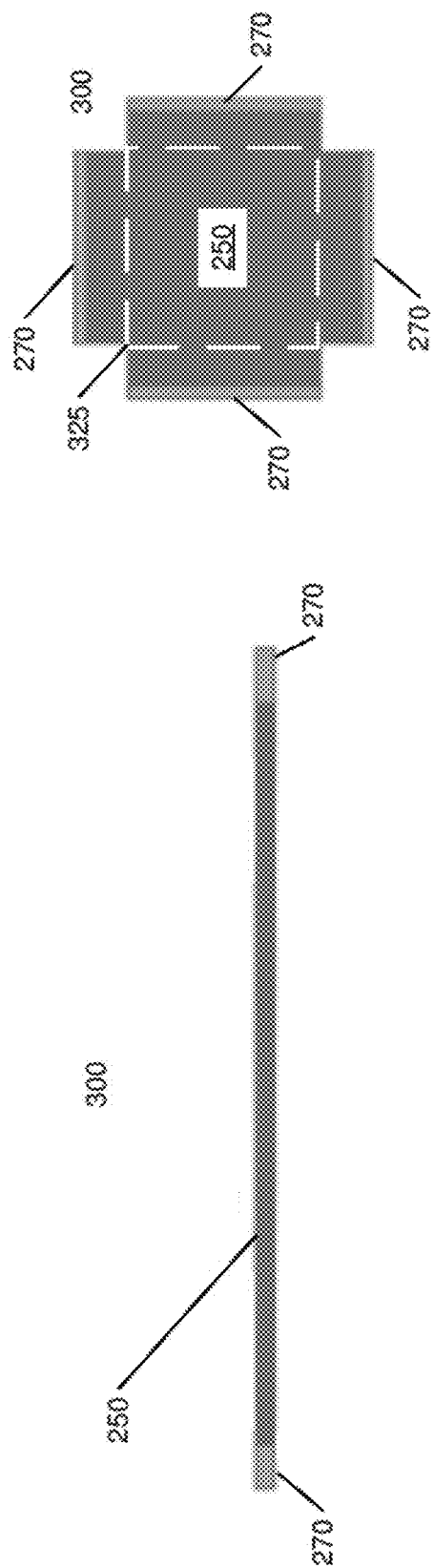
FIG. 3B
FIG. 3A
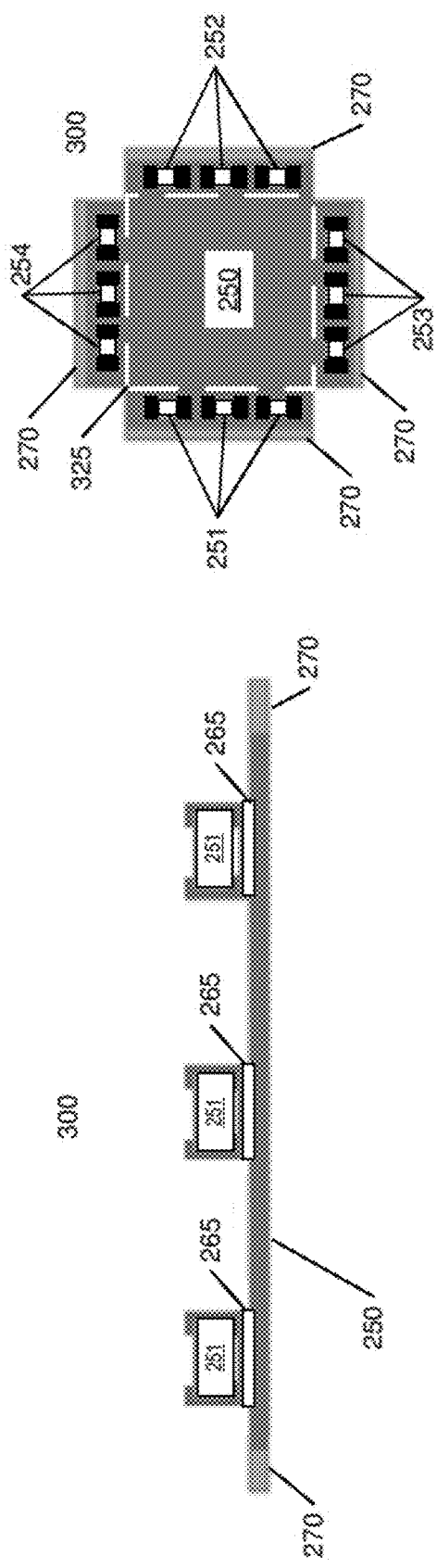
FIG. 4B
FIG. 4A

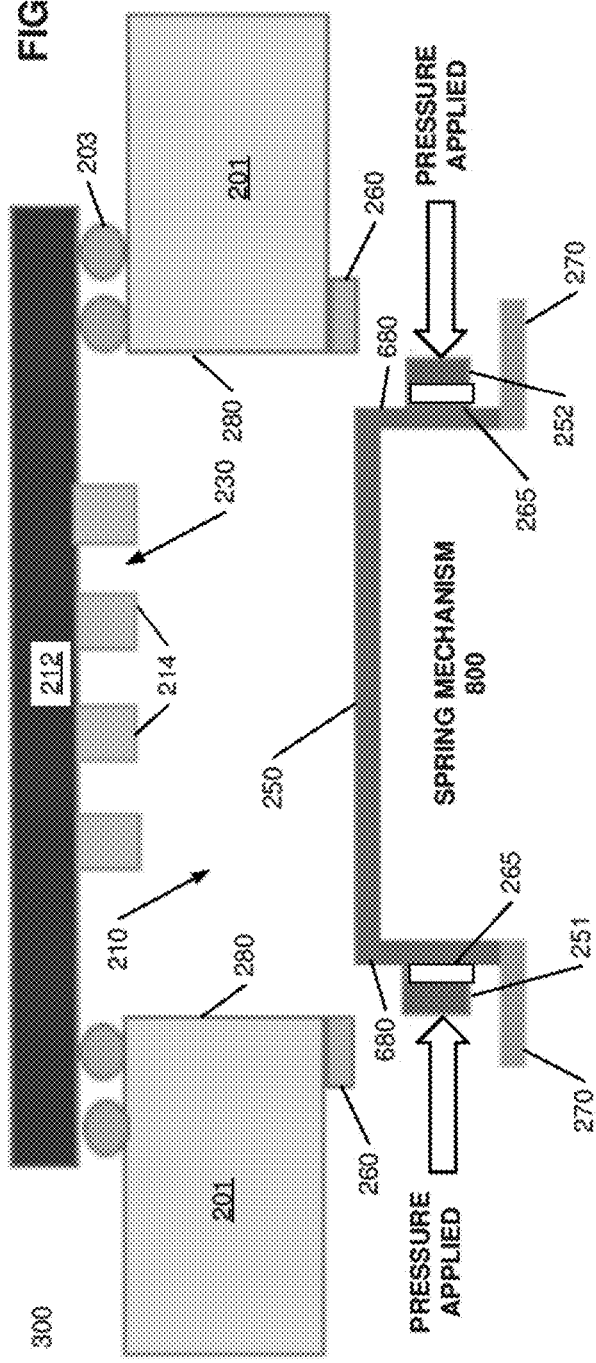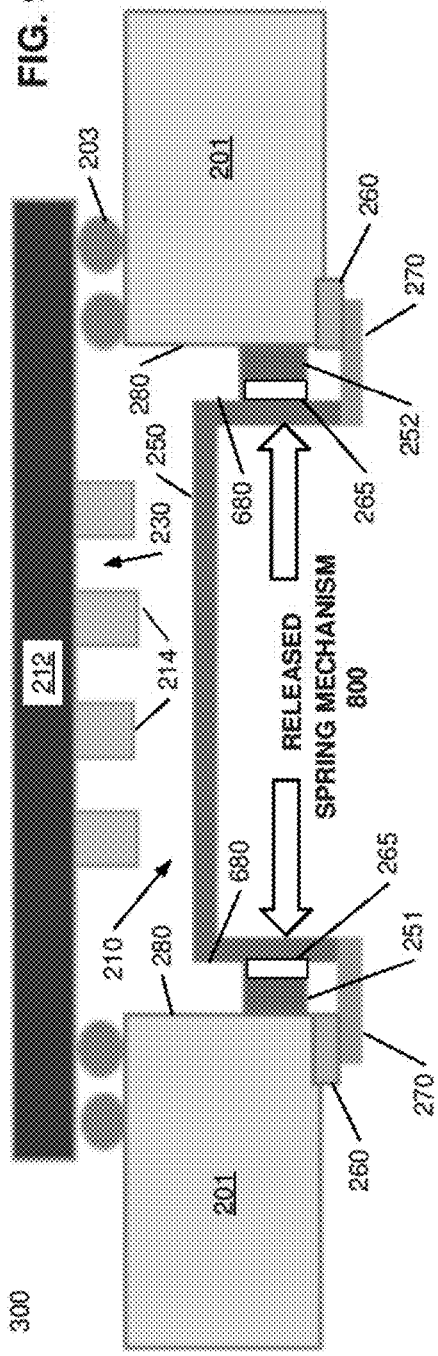

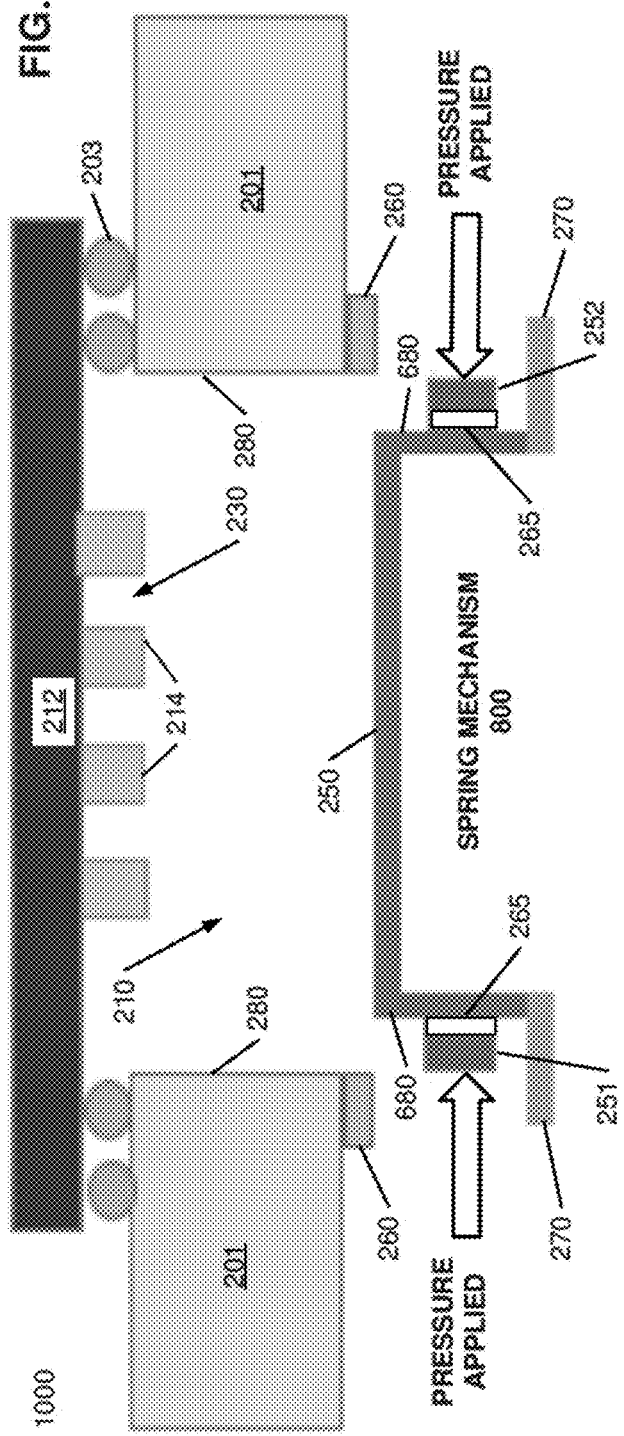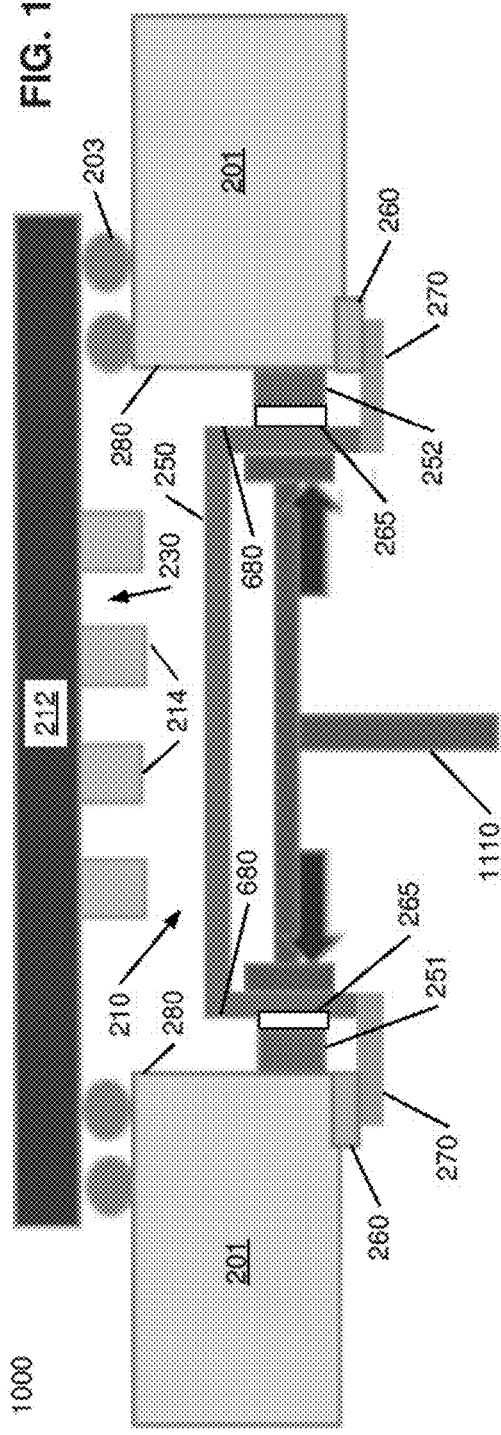

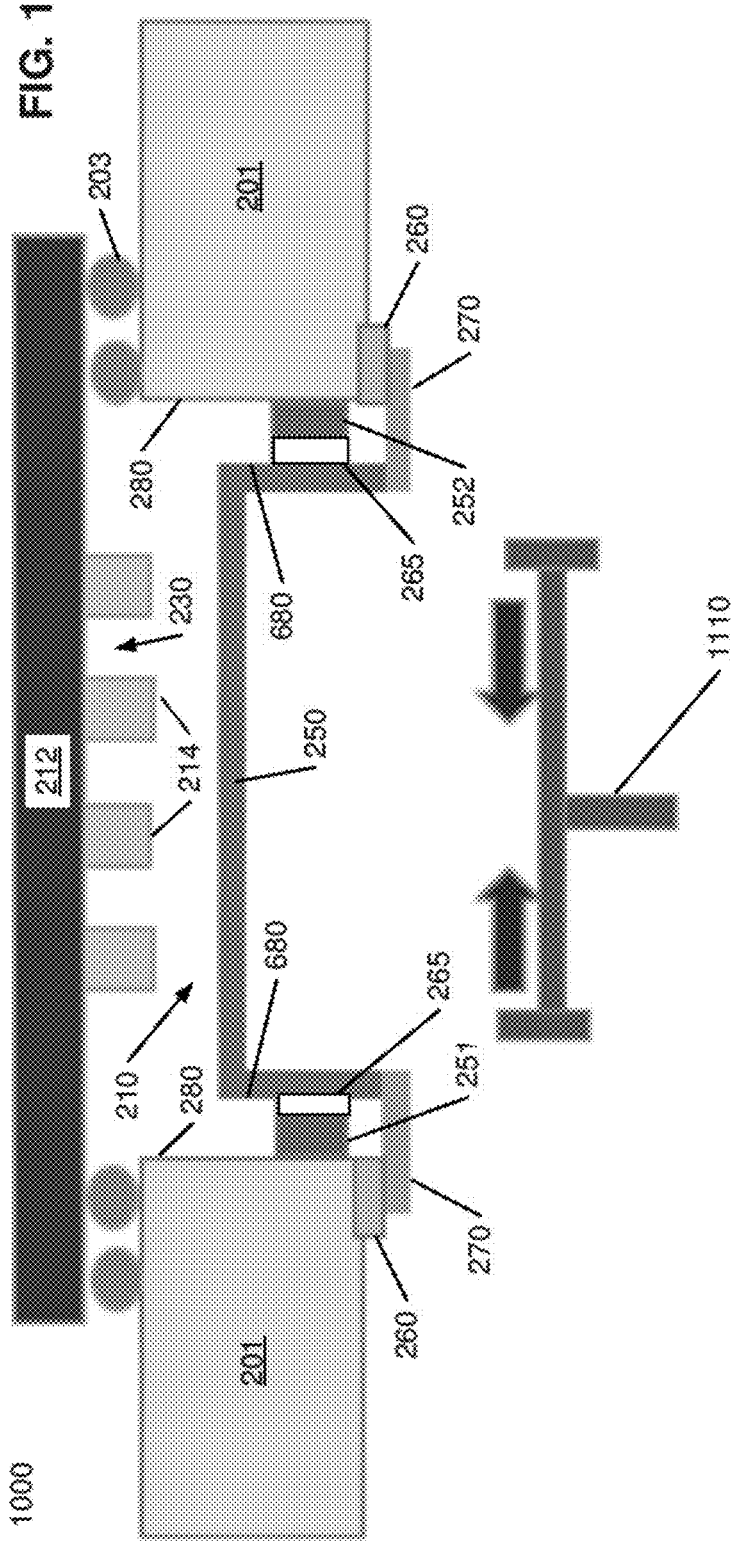

US 11,006,514 B2

THREE-DIMENSIONAL DECOUPLING INTEGRATION WITHIN HOLE IN MOTHERBOARD

CROSS-REFERENCE TO RELATED APPLICATION

This patent application is a U.S. National Phase Application under 35 U.S.C. § 371 of International Application No. PCT/US2017/025152, filed Mar. 30, 2017, entitled "THREE-DIMENSIONAL DECOUPLING INTEGRATION WITHIN HOLE IN MOTHERBOARD," which designates the United States of America, the entire disclosure of which is hereby incorporated by reference in its entirety and for all purposes.

FIELD

Embodiments relate to packaging for electronic devices. More particularly, the embodiments relate to packaging solutions that include decoupling capacitors on the side walls of a hole in motherboard (HiMB).

BACKGROUND

Integrated circuits (ICs), such as mobile small form factor package designs, present several problems. One such problem is that the ICs generate high-frequency noise. High-frequency noise typically propagates through the package resulting in electromagnetic interference (EMI) and radio frequency interference (RFI). High-frequency might further increase regulatory violations and degrade wireless performance.

As an effective approach, packaging solutions use a recess area or a HiMB level (hereinafter referred to as "HiMB") typically in a printed circuit board (PCB). HiMB is required due to the z-height profile of decoupling land side capacitors (LSCs) located on the ICs. This HiMB is further accompanied with a metal shield enclosure that shields off the EMI and RFI to the surrounding components of the ICs. The drive to meet the need for miniaturization (or scaling down) of packages is, however, drastically decreasing the z-height of LSCs. This presents additional problems for packaging solutions, especially for (i) the PCB area utilization of the HiMB and (ii) the capacitors that are unable to be attached on the land side of the PCB under the die shadow, such as edge capacitors.

Conventionally, LSCs are used to suppress high-frequency noise, such as EMI and RFI. LSCs are typically soldered on the bottom of a package and lie between the package and a motherboard. Solder balls may be used to attach the package and the motherboard. The z-height of LSCs (i.e., the protruding height from the land side of the package) is typically a limiting factor in small form factor package design, for example, when the z-height of LSCs exceeds the z-height of solder balls. To accommodate the z-height of the LSCs, a HiMB can be formed on the motherboard and accompanied with an EMI shield that suppresses the EMI and RFI to the surrounding components of the package. The HiMB is typically enclosed with the EMI shield and, therefore, results in an unutilized PCB area.

To meet the demand for miniaturization, packaging solutions utilize the HiMB to house the z-height profile of the LSCs. This typical approach, however, has resulted in two problems. One problem of this approach is that larger capacitors are placed far from the package and on the edges of the motherboard (i.e., edge capacitors), which has proven to be ineffective. Another problem of this approach is that the large PCB area formed with the HiMB and EMI shield is unused and thus considered wasted in terms of PCB area utilization.

BRIEF DESCRIPTION OF THE DRAWINGS

Embodiments described herein illustrated by way of example and not limitation in the figures of the accompanying drawings, in which like references indicate similar features. Furthermore, some conventional details have been omitted so as not to obscure from the inventive concepts described herein.

FIGS. 3A and 4A are perspective view illustrations of a method of forming an EMI shield with one or more 3D capacitors embedded in a HiMB of a motherboard, according to one embodiment.

FIGS. 3B and 4B are top view illustrations of a method of forming an EMI shield with one or more 3D capacitors embedded in a HiMB of a motherboard, according to one embodiment.

FIGS. 5-9 are cross-sectional view illustrations of a method of forming an EMI shield with one or more 3D capacitors embedded in a HiMB of a motherboard, according to one embodiment.

FIGS. 10-12 are cross-sectional view illustrations of a method of forming an EMI shield with one or more 3D capacitors embedded in a HiMB of a motherboard using an assembly handler, according to one embodiment.

FIGS. 13-15A and 16A-17 are cross-sectional view illustrations of a method of forming a HiMB with one or more sidewalls in a motherboard for a semiconductor package, according to one embodiment.

DETAILED DESCRIPTION

A semiconductor package is described herein that includes a foundation layer mounted on a motherboard. The semiconductor package further includes a hole in motherboard (HiMB) that is formed in the motherboard. The semiconductor package also includes an electrical shield (also referred to as an electromagnetic interference (EMI) shield) that is attached to one or more three-dimensional (3D) capacitors and embedded in the HiMB of the motherboard. The 3D capacitors are vertically embedded between the electrical shield and the HiMB. Accordingly, the 3D capacitors are implemented as decoupling capacitors that are embedded within the sidewalls of the HiMB to utilize the unused area under the hole.

Embodiments of the semiconductor package enhance packaging solutions. Embodiments of the semiconductor enable 3D decoupling integration within the HiMB. Embodiments of the semiconductor package include capacitors that are vertically embedded to the side walls of the HiMB (i.e., 3D capacitors) and thus utilizing the unused PCB area of the HiMB. With additional capacitors mounted on the sidewalls of the HiMB, embodiments of the semiconductor package help to reduce the land-side capacitors (LSCs) that are need for the foundation layer. This approach also enables a LSC cavity (also referred to as a land-side cavity) with a shrinking z-height and reduces the overall form factor package design.

Likewise, embodiments of the semiconductor package reduce the PCB area needed for edge capacitors, as the capacitors are instead embedded in the HiMB. These embodiments, therefore, reduce the PCB area utilization and improve the miniaturization of the small form factor packages/platforms. As such, embodiments of the semiconductor package help to overcome the limitations on shrinking packages by reducing the z-height of LSCs, the area (x-y footprint) of motherboards, and the z-height of the HiMBs.

Furthermore, embodiments of the semiconductor package provide EMI and RFI mitigation that improves the electrical performances of the integrated circuits (ICs). Embodiments of the semiconductor package include 3D capacitors that are located closer to the power/ground pads (or balls) of the foundation layer—unlike edge capacitors that are located on the edges of the motherboard and away from the foundation. Accordingly, as the 3D capacitors are located under the foundation layer, these 3D capacitors improve efficiency and have a smaller inductance loop with a shorter path to the ground pads/balls of the foundation layer.

Figure 1:
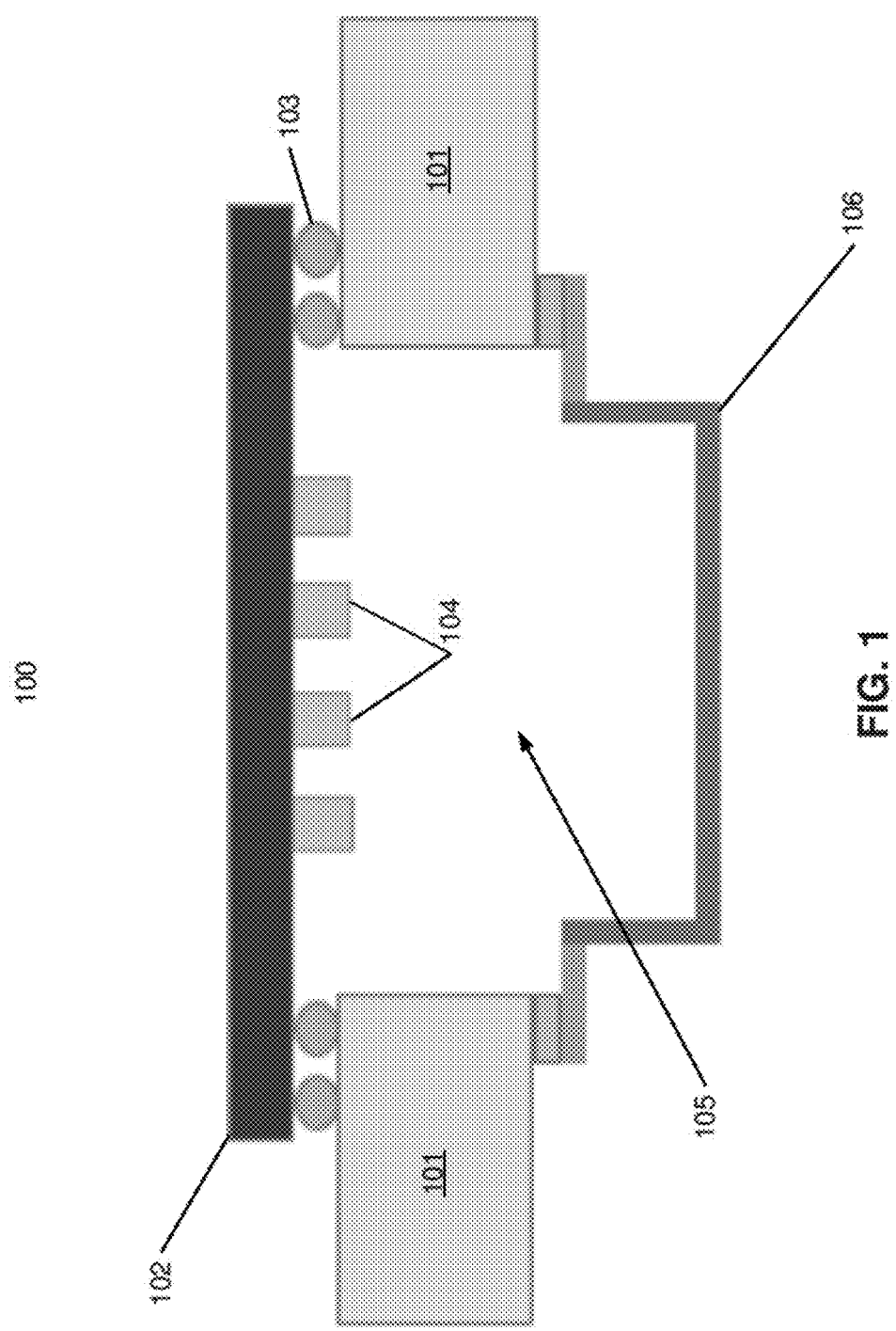
FIG. 1 is a cross-sectional view of a typical semiconductor package that includes a typical HiMB solution.

According to one embodiment, FIG. 1 is a cross-sectional view of a typical semiconductor package assembly 100 that includes a HiMB solution. The typical semiconductor package assembly 100 may include a motherboard 101, a foundation layer 102 (or a chip carrier package/substrate), solder balls 103, one or more land-side capacitors (LSCs) 104, HiMB 105, and EMI shield 106. The LSCs 104 are usually soldered on the bottom of the foundation layer 102 and lie between the foundation layer 102 and the motherboard 101. The solder balls 103 may be used to attach the foundation layer 102 and the motherboard 101. To accommodate the z-height of the LSCs 104, the HiMB 105 is formed on the motherboard 101 and accompanied with the EMI shield 106 that suppresses the EMI and RFI to the surrounding components of the typical semiconductor IC package 100. HiMB 105 is a hole occupying a large x-y area and all the routing layers located under the die shadow region—and thus trading off platform form factors and electrical performance. For example, as shown in FIG. 1, the large hole of the HiMB 105 is enclosed with the EMI shield 106 and, therefore, results in an unutilized PCB area.

To meet the demand for miniaturization, packaging solutions utilize the typical semiconductor package assembly 100 with the HiMB 105 to house the z-height profile of the LSCs 104. This typical approach, however, has provided problems. One problem of this approach is that larger capacitors are placed far from the foundation layer 102 and on the edges of the motherboard 101 (i.e., edge capacitors), which has proven to be ineffective. Another problem of this approach is that the large PCB area formed with the HiMB 105 and EMI shield 106 is unused and thus considered wasted in terms of PCB area utilization. Accordingly, other embodiments have been presented below that can overcome these problems.

Figure 2A:
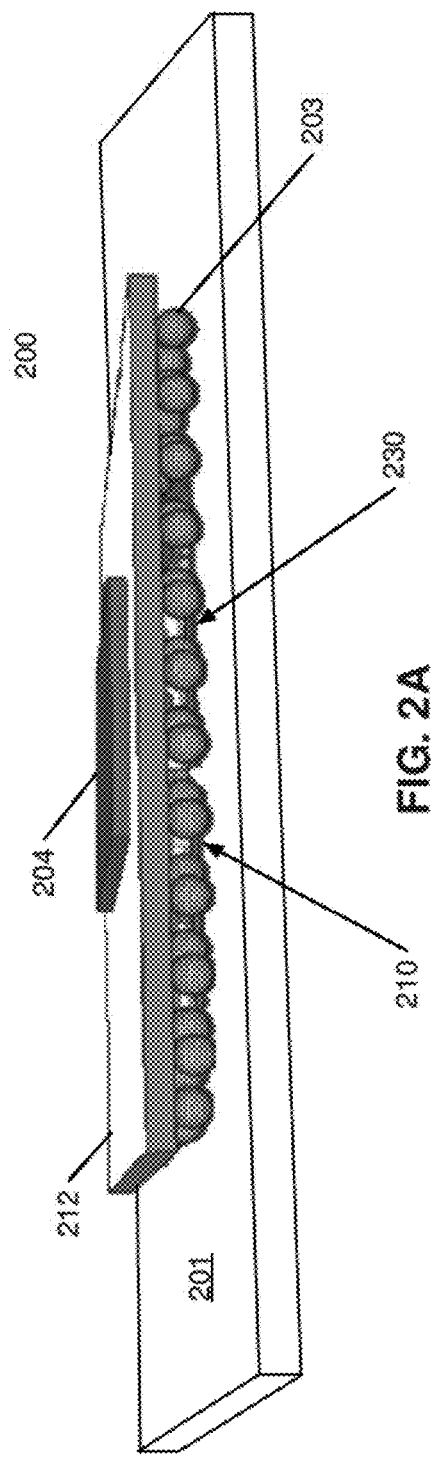
FIG. 2A is a perspective view of a semiconductor package that includes a semiconductor die, a motherboard with a HiMB, a foundation layer, and an EMI shield that further includes one or more 3D capacitors, according to one embodiment.

FIG. 2A is a side, perspective view of semiconductor package 200 that includes semiconductor die 204, motherboard 201, and foundation layer 212. Motherboard 201 has HiMB 210 and LSC cavity 230 (as described in further detail below in FIG. 2B). As used herein, a "HiMB" refers to a recess, a cavity, or a hole in motherboard 201. A "HiMB" is formed under semiconductor die 204 shadow, the land-side of foundation layer 212, and LSC cavity 230 to accommodate LSCs 214 with a large z-height profile. As used herein, a "z-height" refers to a unit of measurement on the z-axis in a three-dimensional package, which is usually oriented vertically. Further, a "HiMB" is often accompanied with an EMI shield (e.g., EMI shield 250 of FIG. 2B). As used herein, an "EMI shield" refers to a shield enclosure—typically a metal shield enclosure—used to suppress (or shield off) the EMI and RFI to the surrounding components of semiconductor package 200. As used herein, a "foundation layer" refers to, but is not limited to, a package, a substrate, a motherboard, and a printed circuit board (PCB).

Foundation layer 212 is mounted on motherboard 201. For one embodiment, foundation layer 212 is a PCB. For one embodiment, the PCB is made of an FR-4 glass epoxy base with thin copper foil laminated on both sides (not shown). For certain embodiments, a multilayer PCB can be used, with pre-preg and copper foil (not shown) used to make additional layers. For example, the multilayer PCB may include one or more dielectric layers, where each dielectric layer can be a photosensitive dielectric layer (not shown). Foundation layer 212 is patterned to form one or more conductive copper traces and pads (not shown) on the top and bottom of foundation layer 212. For some embodiments, holes (not shown) may be drilled in foundation layer 212.

Foundation layer 212 resides (or is mounted) between motherboard 201 and semiconductor die 204. For another embodiment, foundation layer 212 may have a package/substrate (not shown) that is mounted above foundation layer 212, where the semiconductor die 204 is mounted on the package/substrate rather than on foundation layer 212. For one embodiment, semiconductor die 204 includes, but not limited to, an integrated circuit, a CPU, a microprocessor, and a platform controller hub (PCH).

Figure 2B:
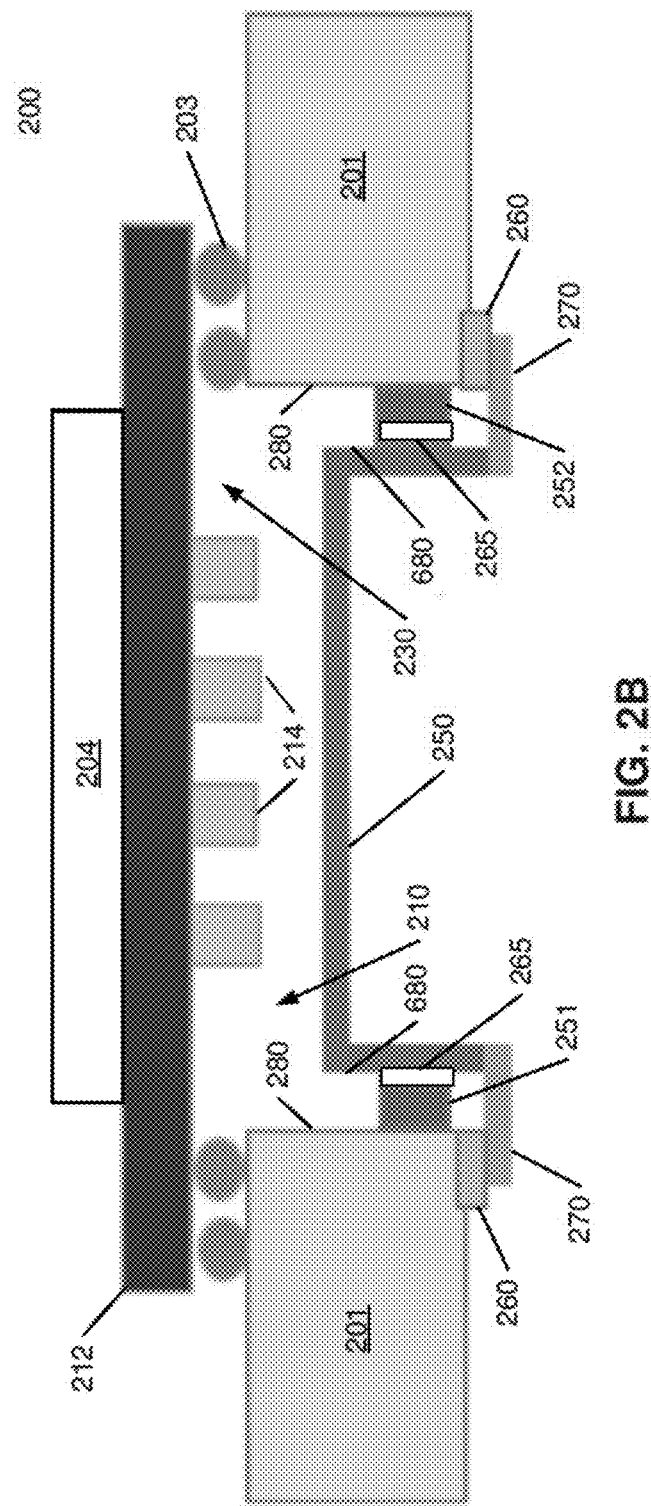
FIG. 2B is a cross-sectional view of a semiconductor package that includes a semiconductor die, a motherboard with a HiMB, a foundation layer, and an EMI shield that further includes one or more 3D capacitors, according to one embodiment.

For embodiment, foundation layer 212 may include LSCs (as shown in FIG. 2B with LSCs 214) to decouple one or more interferences (e.g., EMI and RFI) generated by semiconductor die 204. Semiconductor die 204 may be attached to foundation layer 212 using solder balls or controlled collapse chip connection (C4) bumps (not shown) that connect pads on semiconductor die 204 and foundation layer 212.

For one embodiment, motherboard 201 is also made of a multilayer PCB having copper traces, holes, and metallic pads (not shown). Motherboard 201 may have one or more electronic components, such as microprocessors (or CPUs), memories, ICs, and microelectronics devices, that are mounted/located on the motherboard 201.

Foundation layer 212 is attached to motherboard 201 through the use of solder balls (or bumps) 203 that connect pads (not shown) on foundation layer 212 and motherboard 201. For example, solder balls 203 may be used on a ball grid array (BGA). Note that other methods of connectivity packaging may also be used such as pin grid array (PGA) or land grid array (LGA).

FIG. 2B is a cross-sectional view of semiconductor package 200 that includes semiconductor die 204, motherboard 201, foundation layer 212, HiMB 210, LSC cavity 230, and EMI shield 250.

For one embodiment, semiconductor package 200 has foundation layer 212, motherboard 201, semiconductor die 204, and EMI shield 250. Foundation layer 212 is mounted above motherboard 201. For some embodiments, foundation layer is mounted between semiconductor die 204 and motherboard 201. Foundation layer 212 may include one or more LSCs mounted on the land-side of foundation 212 and under semiconductor die 204.

Motherboard 201 is formed with HiMB 210, LSC cavity 230, and one or more ground pads 260. HiMB 210 may be a circular hole, a square hole, a triangle, a rectangle, or any shape. For one embodiment, HiMB 210 is a square (or rectangular) hole with one or more sidewalls 280, as such for this embodiment HiMB 201 has four sidewalls 280. Note that number of sidewalls 280 will be proportional to the selected shape of HiMB 210 (e.g., a circular hole may have one sidewall, a triangular hole may have three sidewalls, etc.). Note that the sidewalls 280 may be formed using a plated thru hole (also referred to as plated through hole) (PTH) process (as shown in further detail in FIGS. 13-17) or any other drilling/plating process.

For one embodiment, EMI shield 250 is, but is not limited to, a metal plate that has one or more metal pads 270 located along each end of EMI shield 250 (as shown in FIGS. 3B and 4B). EMI shield 250 may be, but is not limited to, a metal plate/sheet, a metal screen, a metal foam, a metal mesh, a Faraday cage, etc., or any other type of material used for EMI/RFI shielding (e.g., a plastic enclosure coated with a metallic ink or similar material).

EMI shield 250 has one or more sidewalls 680. EMI shield 250 also has one or more 3D capacitors 251-252 that are attached (or mounted) vertically to one or more sidewalls 680 of EMI shield 250 with adhesive 265. As used herein, a "3D capacitor" refers to a decoupling capacitor that is mounted/located within HiMB 210, and mounted under foundation layer 212 and LSC cavity region 230. These "3D capacitors" are located closer to the power/ground balls of foundation layer 212, thus providing a smaller/shorter inductance loop (back to the silicon) with a shorter path to the ground pads/balls of foundation layer 212. Further, a "3D capacitor" refers to a capacitor that is vertically attached (on the z-axis) to the one or more sidewalls 280 of HiMB 210 and the one or more sidewalls 680 of EMI shield 250.

The one or more 3D capacitors 251-252 may include one 3D capacitor, two 3D capacitors, three 3D capacitors, four 3D capacitors, etc., or any number of 3D capacitors that are needed. For one embodiment, each of the 3D capacitors 251-252 is a capacitor with a presolder layer that is dipped with a solder layer (as shown in FIG. 4A). For one embodiment, adhesive 265 may be an insulating adhesive, an epoxy adhesive, an adhesive tape, a thermal adhesive layer, a UV releasable tape, or any other type of insulated adhesive.

For one embodiment, the 3D capacitors 251-252 are located on, but not limited to, the outer edges of EMI shield 250. For one embodiment, once EMI shield 250 is shaped (or formed), the side walls 680 of EMI shield 250 are then embedded in the sidewalls 280 of HiMB 210, as the one or metal pads 270 of EMI shield 250 are coupled with the one or more ground pads 260 of motherboard 201. Accordingly, the 3D capacitors 251-252 are vertically embedded between the sidewalls 680 of EMI shield 250 and sidewalls 280 of HiMB 210.

Figure 19:
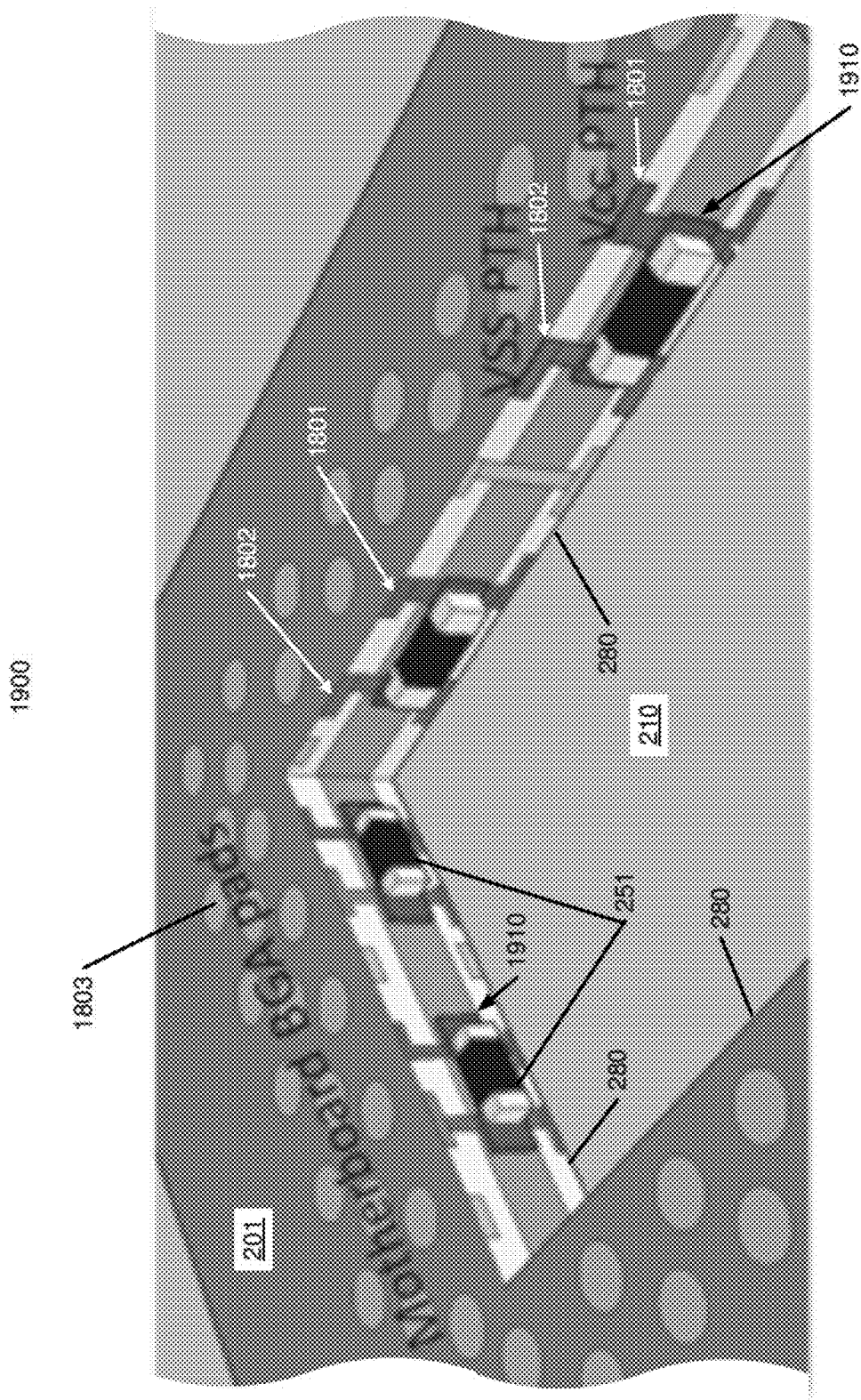
FIG. 19 is a top, perspective view of a semiconductor package that includes a motherboard, a HiMB, and one or more 3D capacitors embedded in the HiMB, according to one embodiment.

According to some embodiments, 3D capacitors 251-252 are each connected on each end of the 3D capacitors 251-252 to a Vss terminal and a Vcc terminal (as shown in FIG. 19), where the terminals are formed on a PTH along sidewalls 280 of HiMB 210. Accordingly, the 3D capacitors 251-252 are mounted/coupled vertically between the sidewalls 680 of EMI shield 250 and sidewalls 280 of HiMB 210, where they are held in place using adhesive layer 265 and a reflow process.

For some embodiments, solder balls 203 collapse as foundation layer 212 is mounted on motherboard 201. Accordingly, the collapsed solder balls 203 have a limited z-height that is smaller than the z-height profile of LSCs 214. To accommodate for the shrinking z-height between foundation layer 212 and motherboard 201, a LSC cavity 230 may be formed in a land-side layer of foundation layer 212. One or more LSCs 214 may be mounted within the LSC cavity 230. The z-height of the LSCs 214 may be a factor in establishing the minimum standoff distance between foundation layer 212 and motherboard 201, and as such, may affect the minimum size solder balls 203 used in a BGA mounting structure. By mounting LSCs 214 within LSC cavity 230, the amount that LSCs 214 protrude from the land-side surface of foundation layer 212 is reduced, also reducing the minimum required standoff distance and the minimum required solder ball size. Smaller solder balls may be spaced closer together, requiring less package surface area for a constant number of BGA connections.

LSC cavity 230, however, may have a z-height that can accommodate the z-heights of some LSCs but not all of the LSCs. HiMB 210 is thus formed to house all the LSCs (e.g., LSCs 214), even if the LSCs protrude past the z-heights of the LSC cavity 230 and solderballs 203. As such, in addition to reducing the z-height of semiconductor package 200, mounting LSCs 214 within LSC cavity 230 of foundation layer 212 and HiMB 210 of motherboard 201 may reduce the x-y-z dimensions of the semiconductor package 200. To further add to reducing the dimensions of semiconductor package 200, EMI shield 250 is embedded within the sidewalls 280 of HiMB 210 (i.e., reducing the z-height dimension of the overall package) and attached vertically to the 3D capacitors 251-252 to reduce (or eliminate) the requirement of edge capacitors on motherboard 201 (i.e., reducing the x-y dimensions of the overall package). Having the overall dimensions of semiconductor package 200 mitigated is advantageous because no additional assembly or part(s) is required, and as such the manufacturing (e.g., original equipment manufacturing (OEM)) complexity and uncertainty is drastically reduced.

For certain embodiments, embedding EMI shield 250 and 3D capacitors 251-252 within the sidewalls 280 of HiMB 210 help to facilitate a 3D decoupling integration within the HiMB 210. As used herein, a "3D decoupling integration" (also referred to as "3D decoupling integration process") refers to the EMI shield 250 and the 3D capacitors 251-252 being embedded/integrated into the HiMB 210 of motherboard 201. This "3D decoupling integration" helps to suppress EMI and RFI to the package. Embedding EMI shield 250 with the attached 3D capacitors 251-252 within the sidewalls 280 of HiMB 210 is even more suitable for smaller form factors, as the dimensions of the package and solder balls keep shrinking. Having 3D capacitors 251-252 formed near semiconductor die 204 and foundation layer 212 rather than using edge capacitors is advantageous because the proximity (i) reduces the x-y dimensions of the overall package; and (ii) improves noise reduction as parasitic inductance generated by vias and routings is minimized.

The 3D decoupling integration within the HiMB 210, therefore, helps to facilitate shrinking and cost saving of the package by reducing the overall dimensions of the package, while also shielding off EMI and RFI to the surrounding devices in the semiconductor package (or the platform). Likewise, with additional capacitors 251-252 placed on the sidewalls 280 of HiMB 210, the semiconductor package 200 can have a smaller LSC cavity 230 and a reduced number of LSCs 214 on the foundation layer 210, which reduces the overall package form factor. At the same time, the 3D decoupling integration helps to eliminate (or reduce) the requirement of edge caps on motherboard 201 by placing these capacitors within HiMB 210.

Note that semiconductor package 200 may include fewer or additional packaging components based on the desired packaging design.

Figure 20:
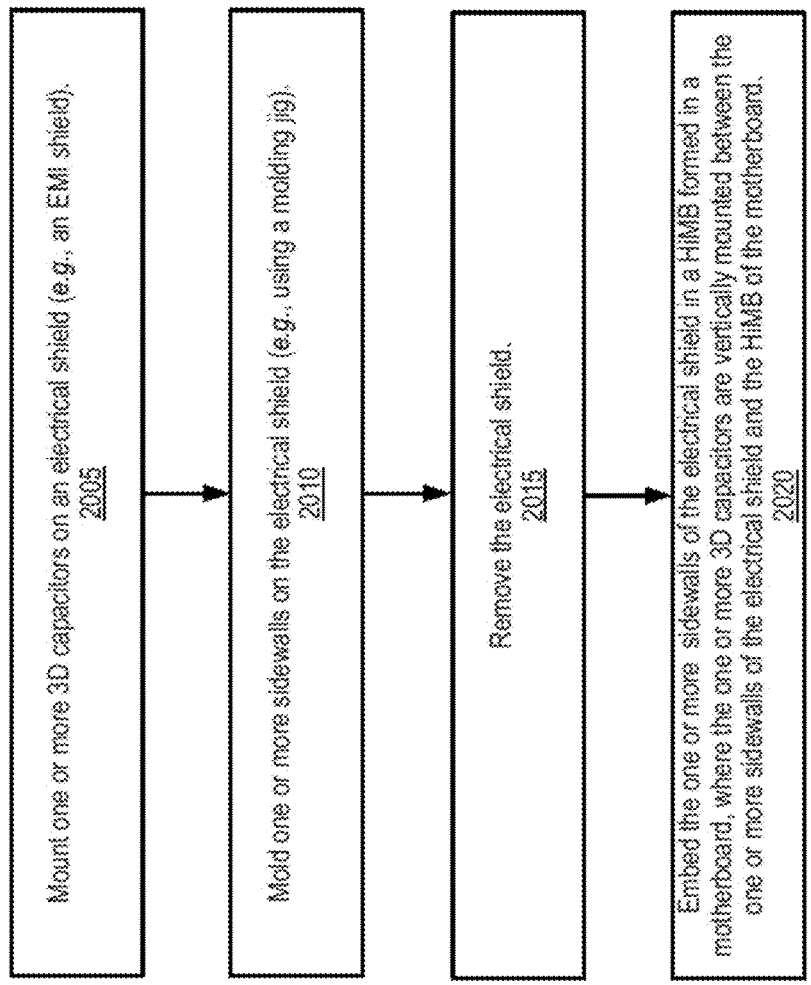
FIG. 20 is a process flow illustrating a method of forming an EMI shield with one or more 3D capacitors to embed into a HiMB of a motherboard in a semiconductor package, according to one embodiment.

FIGS. 3-9 illustrate a process flow (as shown in FIG. 20) of forming semiconductor package 300 with EMI shield 250 including one or more 3D capacitors 251-254 that is embedded in sidewalls 280 of HiMB 210 of motherboard 201.

FIGS. 3A and 4A are perspective view illustrations of a method of forming an EMI shield 250 with one or more 3D capacitors 251-254. FIGS. 3B and 4B are top view illustrations of a method of forming an EMI shield 250 with one or more 3D capacitors 251-254.

Referring now to FIGS. 3A and 3B. FIG. 3A illustrates semiconductor package 300 forming EMI shield 250 with one or more metal pads 270. For one embodiment, as shown in FIG. 3B, EMI shield 250 is a metal plate (or sheet) with a folding edge line 325 (shown as a white broken line) that has four folding edges. For example, one metal pad 270 is located on the outer end (or at least one end) of each folding edge of EMI shield 250. Note that folding edge line 325 is used to illustrate the top edge lines of EMI shield 250 that are formed as EMI shield 250 is molded with a molding jig (e.g., molding jig 501 of FIG. 5). Also note that EMI shield 250, as described above, may be formed of any type of shape, and folding edge line 325 may thus be formed of any type of shape.

FIG. 4A illustrates mounting one or more 3D capacitors 251 on EMI shield 250 of semiconductor package 300. For some embodiments, one or more 3D capacitors 251 are mounted (or attached) above EMI shield 250 using adhesive 265. For one embodiment, each 3D capacitor 251 is a capacitor that has at least two terminals (e.g., voltage at the common collector (Vcc) 1801 and voltage at the source supply (Vss) 1802 of FIG. 18A), where each terminal is located on one of the two ends of each 3D capacitor 251. For one embodiment, each 3D capacitor 251 has presolder (or dipped with solder) on each terminal end, for example, a Vcc terminal and a Vss terminal. For one embodiment, the presolder of 3D capacitor 351 allows each terminal end of 3D capacitor 251 to be vertically attached (or coupled) to at least one of a Vcc PTH (e.g., Vcc PTH 1801 of FIG. 19) or a Vss PTH (e.g., Vss PTH 1802 of FIG. 19) that is formed on a sidewall of a motherboard (e.g., sidewall 280 of HiMB 210 of FIG. 19). Note that FIG. 4A illustrates a side, perspective view of EMI shield 250 of semiconductor package 300 and may have omitted (or briefly described) one or more components to facilitate the described embodiments.

Referring now to FIG. 4B, one or more 3D capacitors 251-254 are mounted on EMI shield 250. The 3D capacitors 251-254 are mounted on one of four folding edges, where each folding edge has three 3D capacitors 251-254. For example, 3D capacitors 251 are located on one folding edge of EMI shield 250 and along (or beside) metal pad 270, while 3D capacitors 252 are located on the opposite folding edge of EMI shield 250. Each of the 3D capacitors 251-254 are mounted parallel to the axis along each of the metal pads 270 of EMI shield 250, as such the 3D capacitors 251-254 will be vertically mounted on each edge of EMI shield 250 when EMI shield 250 is molded (as shown in FIGS. 5-9). Note that semiconductor package 300 may include fewer or additional 3D capacitors based on the desired packaging design.

Figure 5:
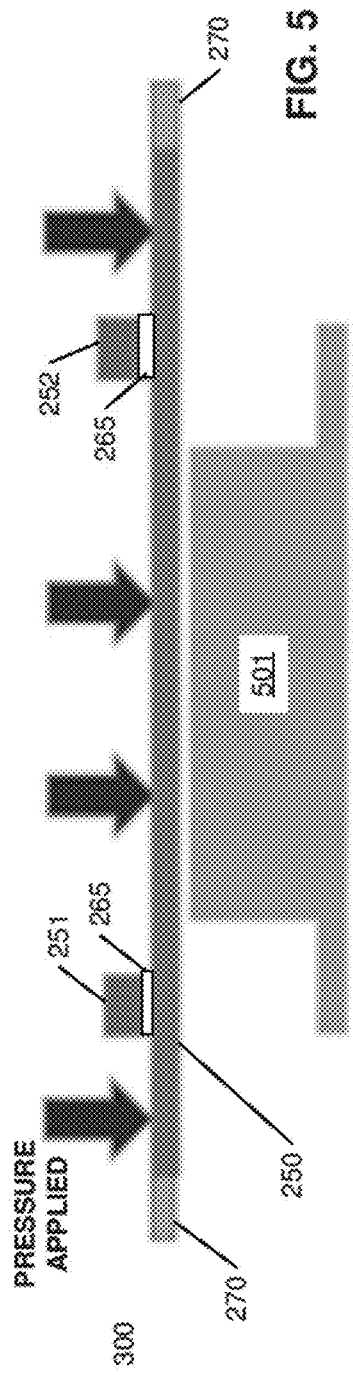
Figure 6:
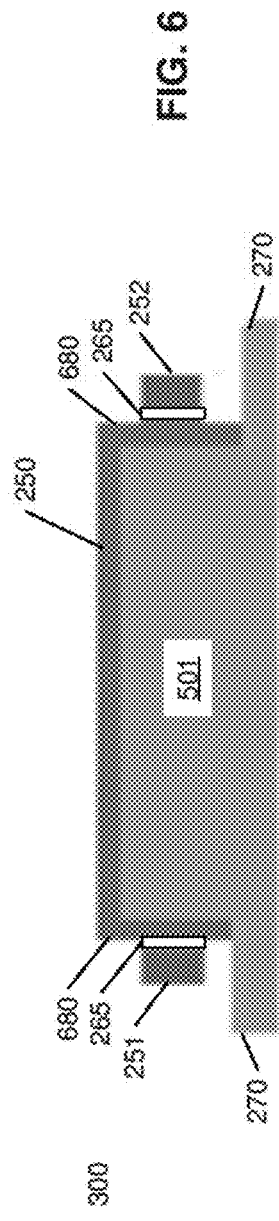
Figure 7:
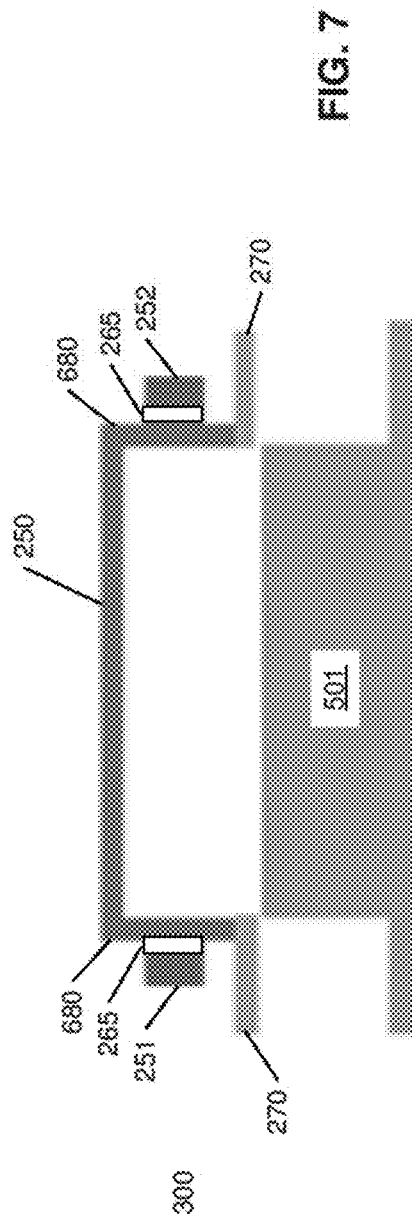

FIGS. 5-9 are cross-sectional view illustrations of semiconductor package 300. Specifically, FIGS. 5-7 illustrate a method of molding EMI shield 250 with one or more 3D capacitors 251-252.

FIG. 5 illustrates EMI shield 250, 3D capacitors 251-252, and molding jig 501. For one embodiment, EMI shield 250 is placed above molding jig 501. Molding jig 501 is a mold that is used to mold/form a metal plate into a desired shape (e.g., an EMI/RFI rectangular enclosure) based on the form factor package design. For example, folding edge lines (e.g., folding edge line 325 of FIG. 4B) of EMI shield 250 may be directly placed above the top edge lines of molding jig 501. Accordingly, EMI shield 250 has pressure applied to the top side of EMI shield 250 and thus compressed onto molding jig 501 (as shown in FIG. 6). For some embodiments, a molding process is used to apply pressure to EMI shield 250 and mold EMI shield 250 with molding jig 501. Note that the molding process includes, but is not limited to, a compression molding/printing, a pressure printing, a vacuum printing, etc., a combination thereof, or any other type of similar process.

Figure 18A:
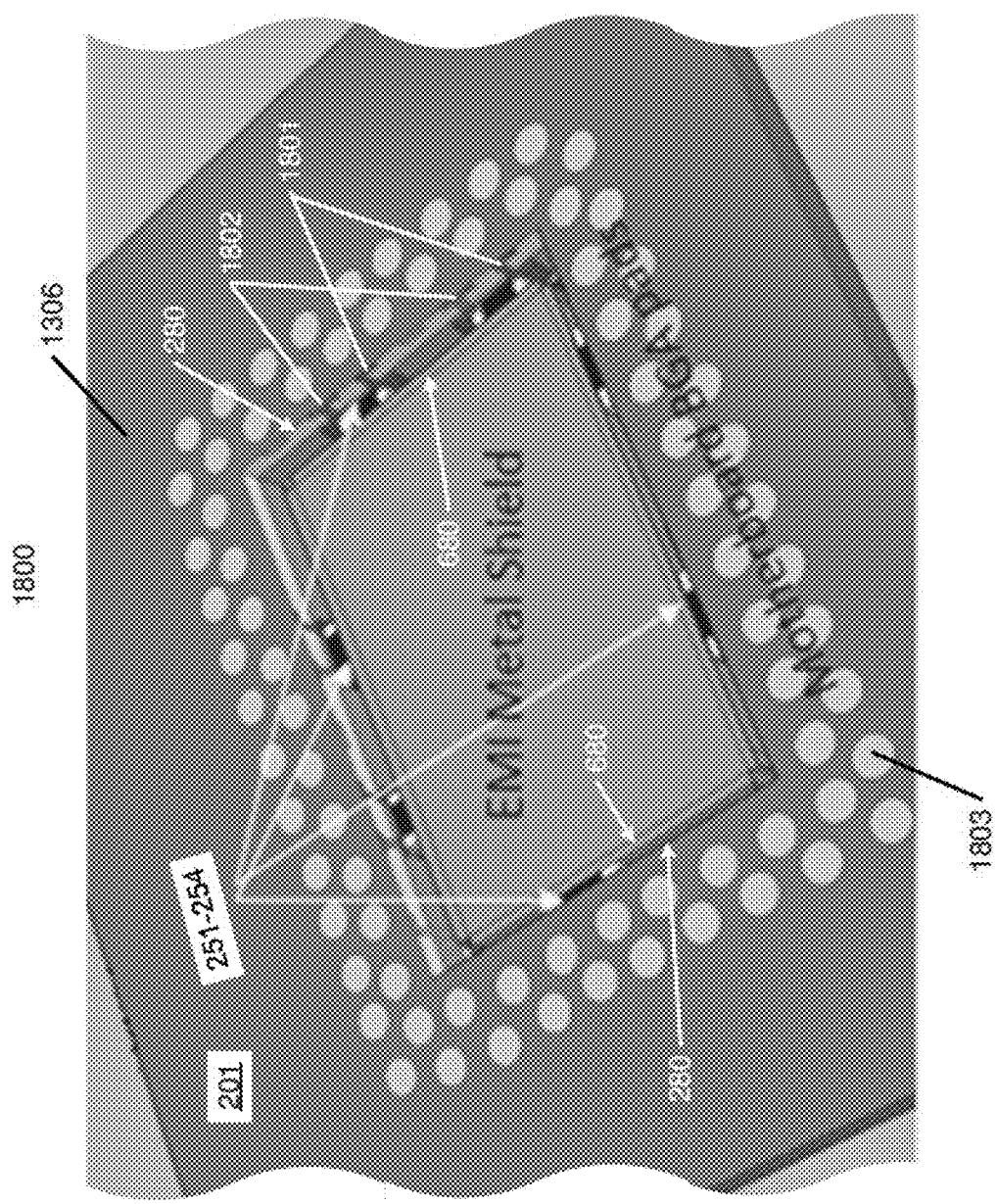
FIG. 18A is a top, perspective view of a semiconductor package that includes a motherboard, a HiMB, and an EMI shield that further includes one or more 3D capacitors embedded in the HiMB, according to one embodiment.
Figure 18B:
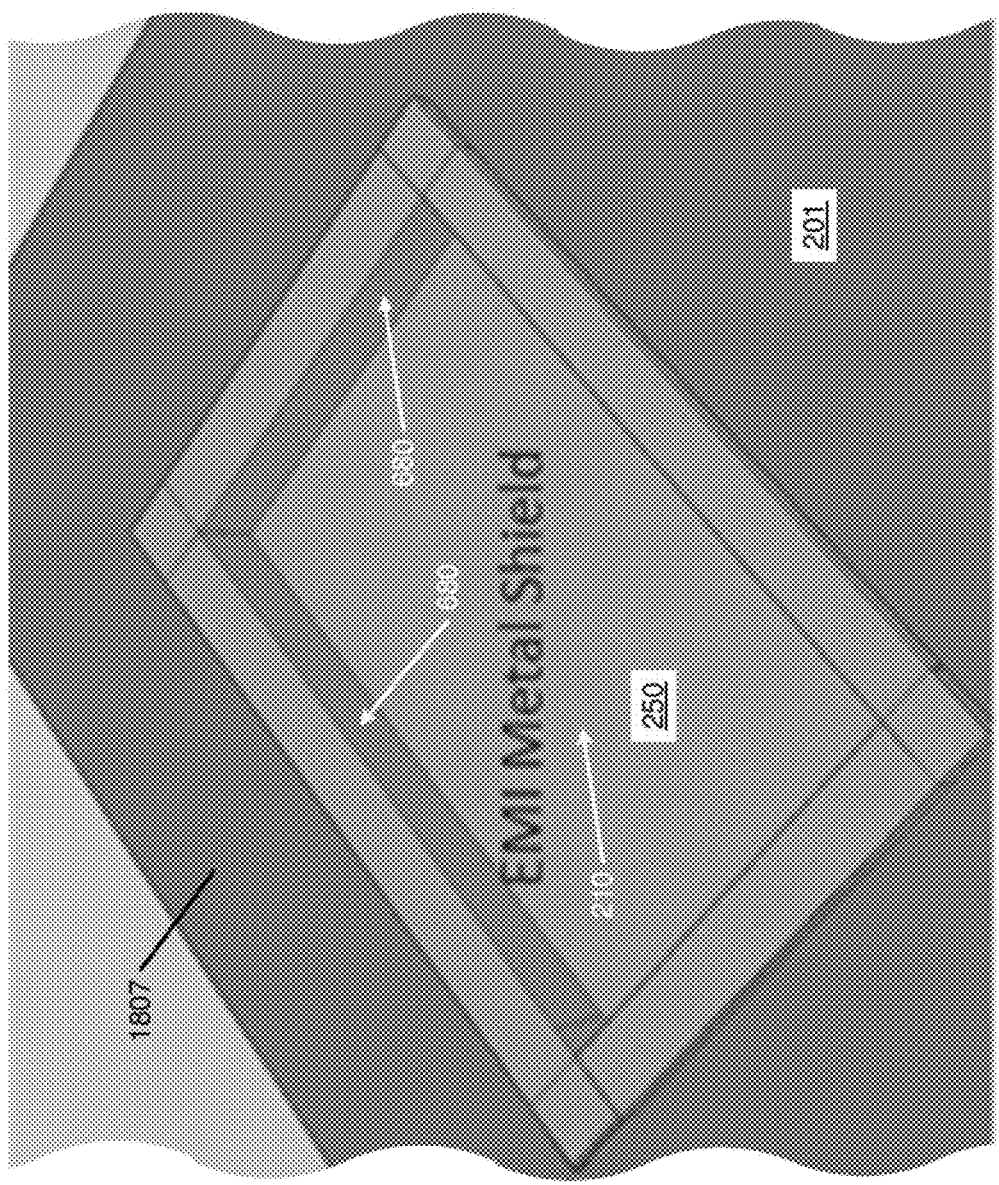
FIG. 18B is a bottom, perspective view of a semiconductor package that includes a motherboard, a HiMB, and an EMI shield, according to one embodiment.

After applying pressure at the edges of EMI shield 250, FIG. 6 illustrates EMI shield 250 molded into an EMI shield enclosure (as shown in FIG. 18B) with one or more sidewalls 680 using molding jig 501. For example, EMI shield 250 may have four sidewalls 680. EMI shield 250 also has one or more 3D capacitors 251-252 that are mounted vertically to the one or more sidewalls 680 of EMI shield 250, where each 3D capacitor 251-252 is attached to EMI shield 250 using adhesive 265. Note, for example, that with a top view of EMI shield 250 (as shown in FIG. 4B) each of the 3D capacitors 251-254 is mounted vertically on each of the four sidewalls 680 of EMI shield 250, respectively.

For example, EMI shield 250 may have formed an open rectangular shape, as the EMI shield enclosure, with at least four sidewalls 680, a top wall, and four metal pads metal pads 270. For one embodiment, the four side walls 680 of EMI shield 250 will be embedded into (or parallel to) the sidewalls 280 of HiMB 210 of motherboard 201 (as shown in FIG. 18A). Accordingly, for one embodiment, the top wall of EMI shield 250 will be mounted directly below the LSCs 214 and LSC cavity 230 of foundation layer 212 (as shown in FIG. 9). Continuing with the above example, the four metal pads (e.g., two of the four metal pads 270 are shown in FIG. 6) of EMI shield 250 are perpendicular to the four sidewalls 680 and located below the one or more 3D capacitors 251-254, where each metal pad 270 will be coupled to a ground pad 260 of motherboard 201 (as shown in FIG. 9). FIG. 7 illustrates removing EMI shield 250 from molding jig 501 after the EMI shield 250 has been firmly molded.

Now that EMI shield 250 has been molded, FIGS. 8-9 show a 3D decoupling integration process of semiconductor package 300 using spring mechanism 800. Specifically, FIGS. 8-9 show embedding the 3D capacitors 251-252 and sidewalls 680 of EMI shield 250 into sidewalls 280 of HiMB 210 of motherboard 201. Note that semiconductor package 300 of FIGS. 3-9 is similar to semiconductor package 200 of FIGS. 2A-2B.

FIG. 8 shows pressure being applied (as shown with the white arrows) to EMI shield 250 with spring mechanism 800. For example, spring mechanism 800 may be used within EMI shield 250 to compress/squeeze the sidewalls 680 of EMI shield 250 (in the direction of the white arrows), which allows the EMI shield 250 to insert HiMB 210. Spring mechanism 800 may be, but is not limited to, a spring, a coil, or any type of elastic mechanism. As shown in FIG. 8, when pressure is applied to the sidewalls 680 of EMI shield 250, EMI shield 250 may now be embedded (or inserted) within sidewalls 280 of HiMB 210 of motherboard 201—until metal pads 270 of EMI shield 250 are pressed (or coupled) with ground pads 260 of motherboard 201.

FIG. 9 shows sidewalls 680 of EMI shield 250 embedded within sidewalls 280 of HiMB 210 of motherboard 201. For example, spring mechanism 800 has been released to its original state within EMI shield 250, as such EMI shield 250 has been released to its original state. This includes 3D capacitors 251-252 mounted vertically between sidewalls 280 of HiMB 210 and sidewalls 680 of EMI shield 250, and ground pads 260 of motherboard 201 coupled to metal pads 270 of EMI shield 250. Continuing with the example above of FIG. 8, spring mechanism 800 may now be released within EMI shield 250 to return the sidewalls 680 of EMI shield 250 (in the direction of the white arrows), which presses (or sandwiches) 3D capacitors into its place between sidewalls 280 of HiMB 201 and sidewall 680 of EMI shield 250 as shown in FIG. 9.

Figure 18C:
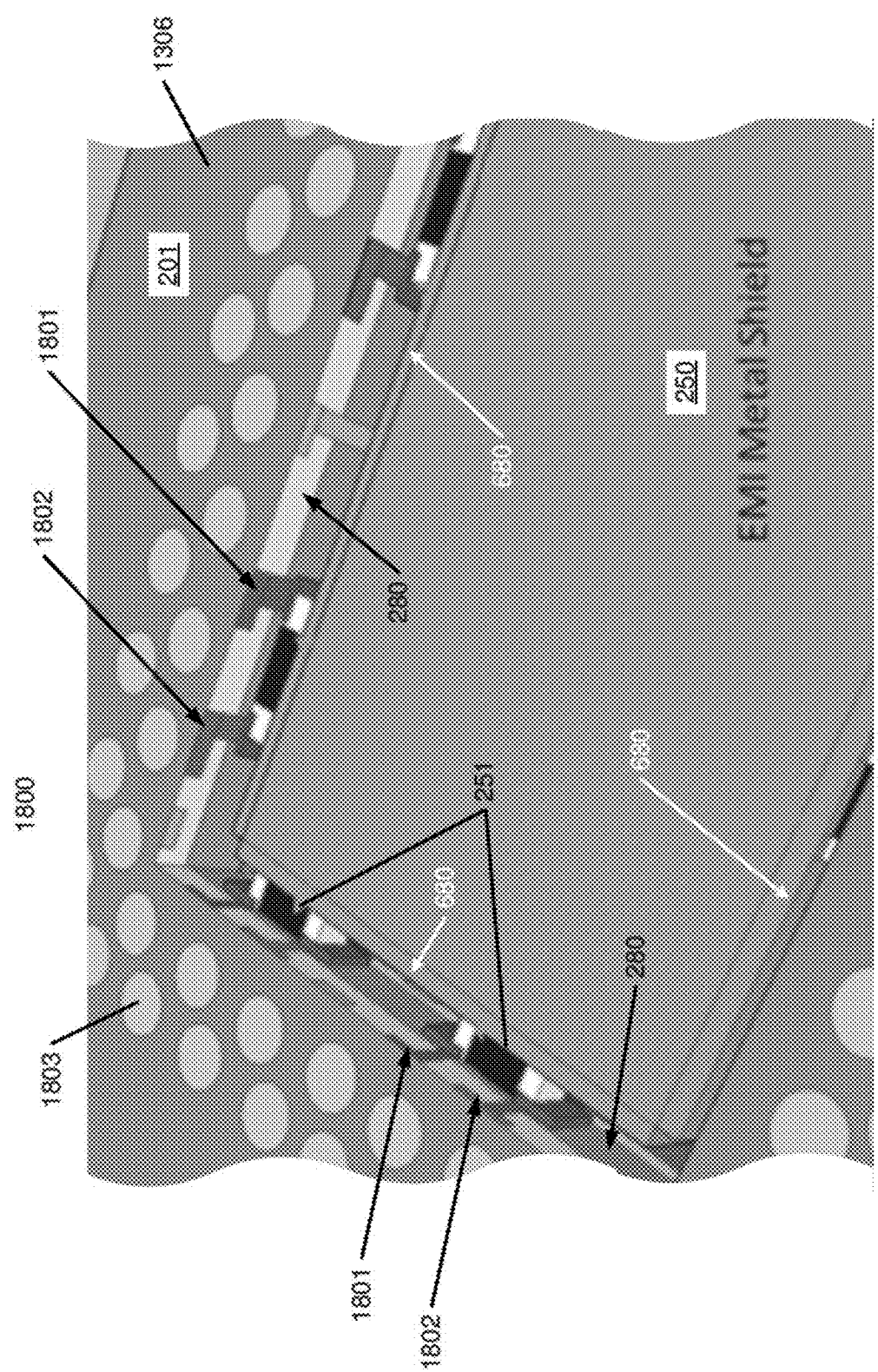
FIG. 18C is a close-up of a top, perspective view of a semiconductor package that includes a motherboard, a HiMB, and an EMI shield that further includes one or more 3D capacitors embedded in the HiMB, according to one embodiment.

Accordingly, as shown in FIG. 9, once spring mechanism 800 is released, EMI shield 250 is embedded into HiMB 210 of motherboard 201 and located under LSCs 214 and LSC cavity 230 of foundation layer 212. For some embodiments, 3D capacitors 251-252 and metal pads 270 of EMI shield 250 are held into place with a reflow/soldering process (as shown in FIGS. 18A, 18C, and 19) or any other processes known in the art. Note that foundation layer 212 may include a semiconductor die (e.g., semiconductor die 204 of FIGS. 2A-B) mounted above foundation layer 212 and EMI shield 250. Also note that semiconductor package 300 may include fewer or additional packaging components based on the desired packaging design.

FIGS. 10-12 show a 3D decoupling integration process of semiconductor package 1000 using spring mechanism 800 and assembly handler 1110. According to some alternative embodiments, FIGS. 10-12 are cross-sectional views illustrations of embedding EMI shield 250 with one or more 3D capacitors 251-252 into sidewalls 280 of HiMB 210 of motherboard 201 using assembly handler 1110. Note that semiconductor package 1000 of FIGS. 10-12 is similar to semiconductor package 200 of FIGS. 2A-2B. Meanwhile, semiconductor package 1000 of FIGS. 10-12 is similar to semiconductor package 300 of FIGS. 3-9, but semiconductor package 1000 uses assembly handler 1110 to further hold EMI shield 250 embedded (or in place) within sidewalls 280 of HiMB 210 (as shown below in FIGS. 11-12).

FIG. 10 shows pressure being applied (as shown with the white arrows) to EMI shield 250 with spring mechanism 800. For example, spring mechanism 800 may be used within EMI shield 250 to compress/squeeze the sidewalls 680 of EMI shield 250 (in the direction of the white arrows), which allows the EMI shield 250 to insert HiMB 210. As shown in FIG. 10, when pressure is applied to the sidewalls 680 of EMI shield 250, EMI shield 250 may now be embedded (or inserted) within sidewalls 280 of HiMB 210 of motherboard 201—until metal pads 270 of EMI shield 250 are pressed (or coupled) with ground pads 260 of motherboard 201.

FIG. 11 shows sidewalls 680 of EMI shield 250 embedded within sidewalls 280 of HiMB 210 of motherboard 201. For example, spring mechanism 800 has been released to its original state within EMI shield 250, as such EMI shield 250 has been released to its original state. This state includes 3D capacitors 251-252 mounted vertically between sidewalls 280 of HiMB 210 and sidewalls 680 of EMI shield 250, and ground pads 260 of motherboard 201 coupled to metal pads 270 of EMI shield 250. Continuing with the example above of FIG. 10, spring mechanism 800 may now be removed from within EMI shield 250 to return the EMI shield 250 to its original state. Then, assembly handler 1110 is inserted (from below) into EMI shield 250 to hold/press (in the direction of the black arrows), which presses (or sandwiches) 3D capacitors into its place between sidewalls 280 of HiMB 201 and sidewalls 680 of EMI shield 250 as shown in FIG. 11.

For one embodiment, assembly handler 1110 has a "T" shape with at least two arms on each end of the assembly handler 1110. Assembly handler 1110 may be made from any rigid material and have any other type of shape that may be used to hold and fit into an EMI shield enclosure, such as EMI shield 250.

As shown in FIG. 11, each arm of assembly handler 1110 holds EMI shield 250 in place, i.e., capacitors 251-252 are mounted vertically between sidewalls 280 of HiMB 210 and EMI shield 250 (or sidewalls 680 of EMI shield 250), and ground pads 260 of motherboard 201 are coupled to metal pads 270 of EMI shield 250. EMI shield 250 is now embedded within sidewalls 280 of HiMB 210 of motherboard 201 using assembly handler 1110 and located under LSCs 214 and LSC cavity 230 of foundation layer 212. For some embodiments, 3D capacitors 251-252 and metal pads 270 of EMI shield 250 are held in place with assembly handler 1110, as a reflow/soldering process is used to couple (or attach) the terminals of each of the 3D capacitors 251-252 with their respective Vcc PTH and Vss PTH (e.g., as shown in FIGS. 18A, 18C, and 19).

FIG. 12 shows removing assembly handler 1110 from under EMI shield 250. For example, after the reflow process, assembly handler 1110 releases its grip from within EMI shield 250 and is thus removed. Note that foundation layer 212 of FIGS. 10-12 may include a semiconductor die (e.g., semiconductor die 204 of FIGS. 2A-B) mounted above foundation layer 212 and EMI shield 250. Also note that semiconductor package 1000 may include fewer or additional packaging components based on the desired packaging design.

FIGS. 13-15A and 16A-17 are cross-sectional view illustrations of a method of forming a HiMB with one or more sidewalls in a motherboard for a semiconductor package.

Figure 14:
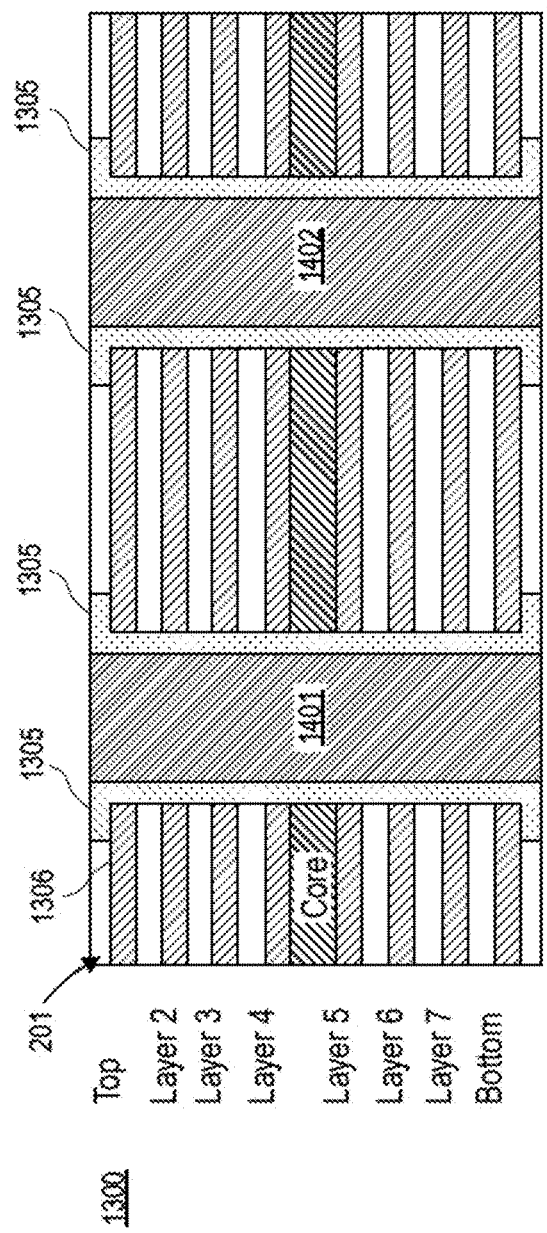
Figure 15A:
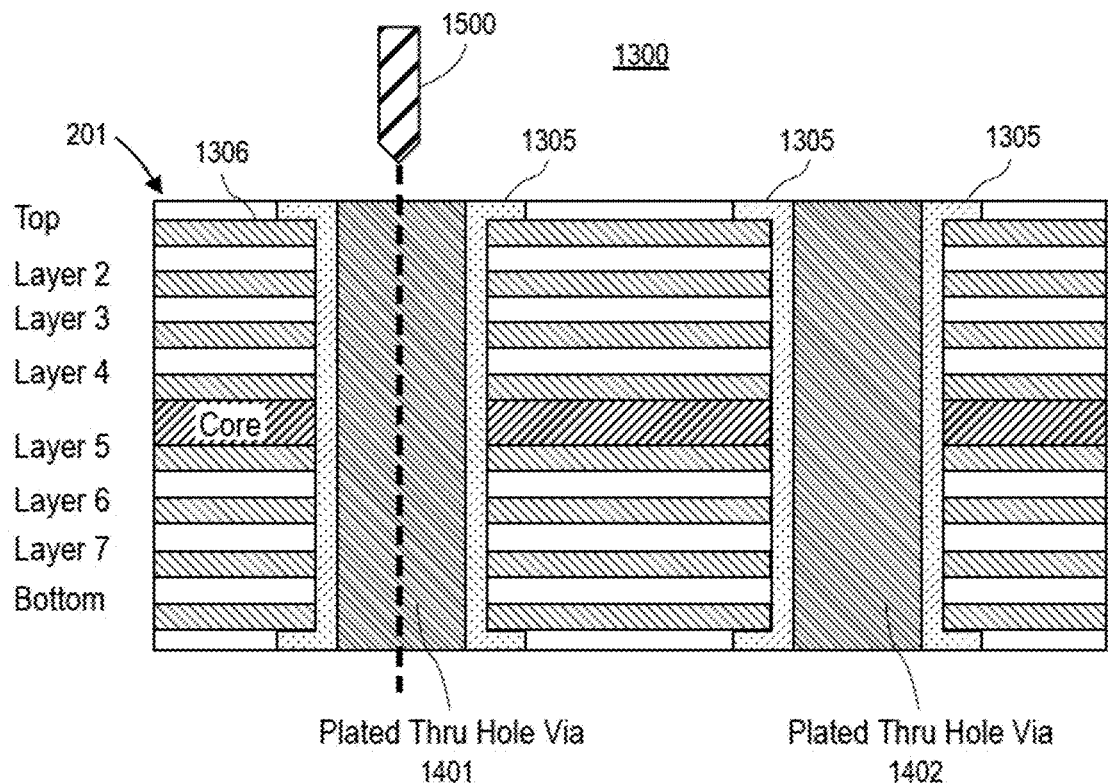
Figure 15B:
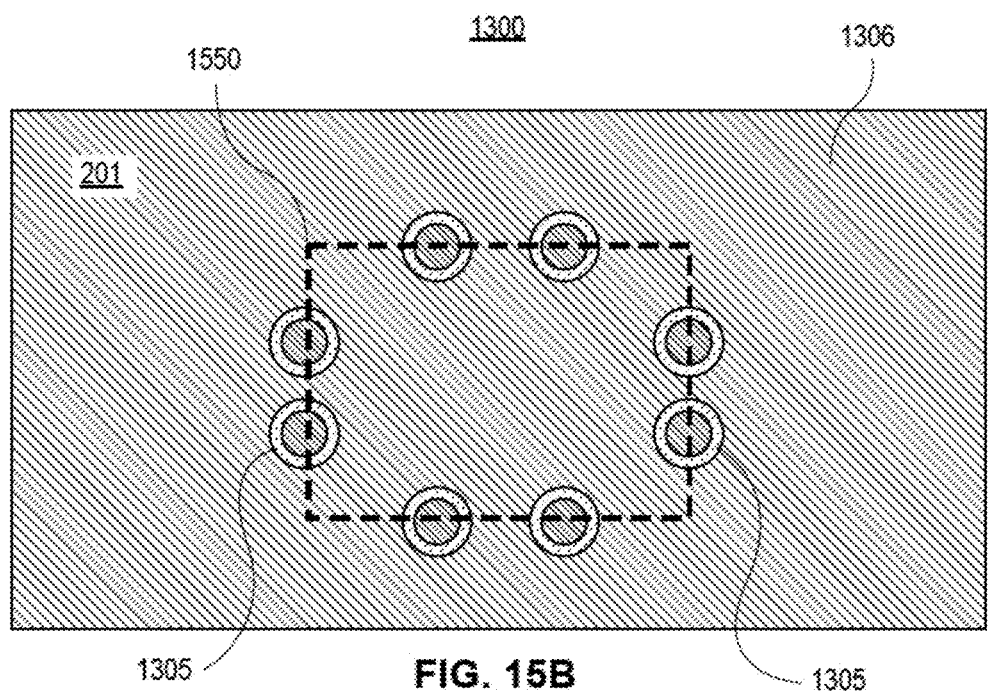
FIGS. 15B and 16B are top view illustrations of a method of forming a HiMB with one or more sidewalls in a motherboard for a semiconductor package, according to one embodiment.
Figure 16A:
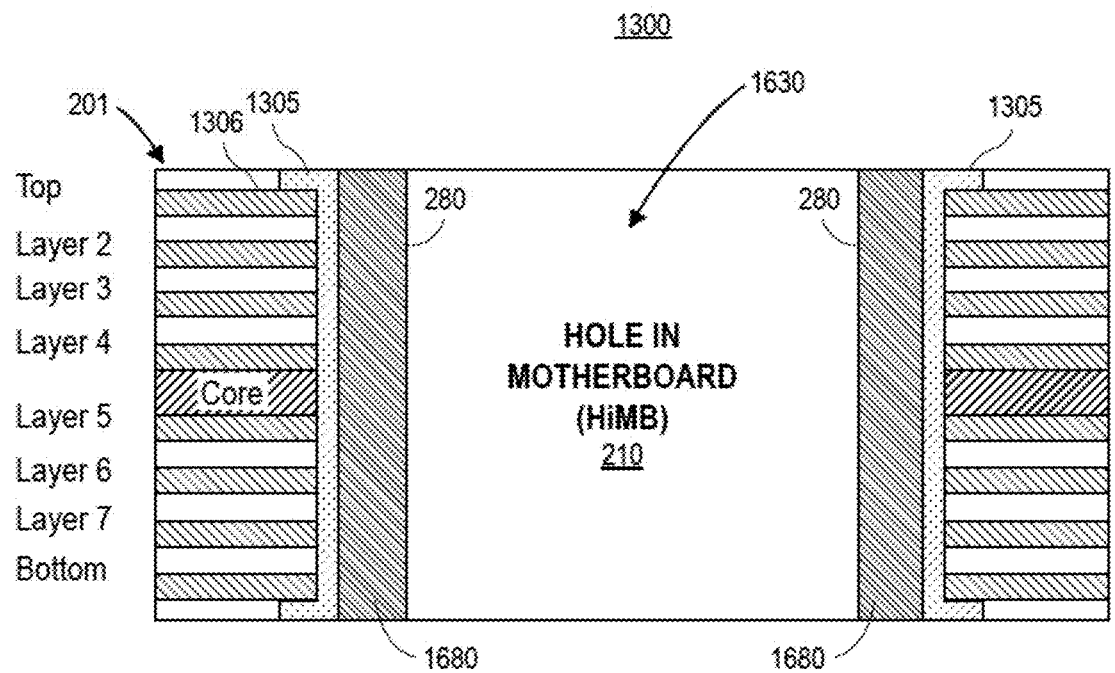
Figure 16B:
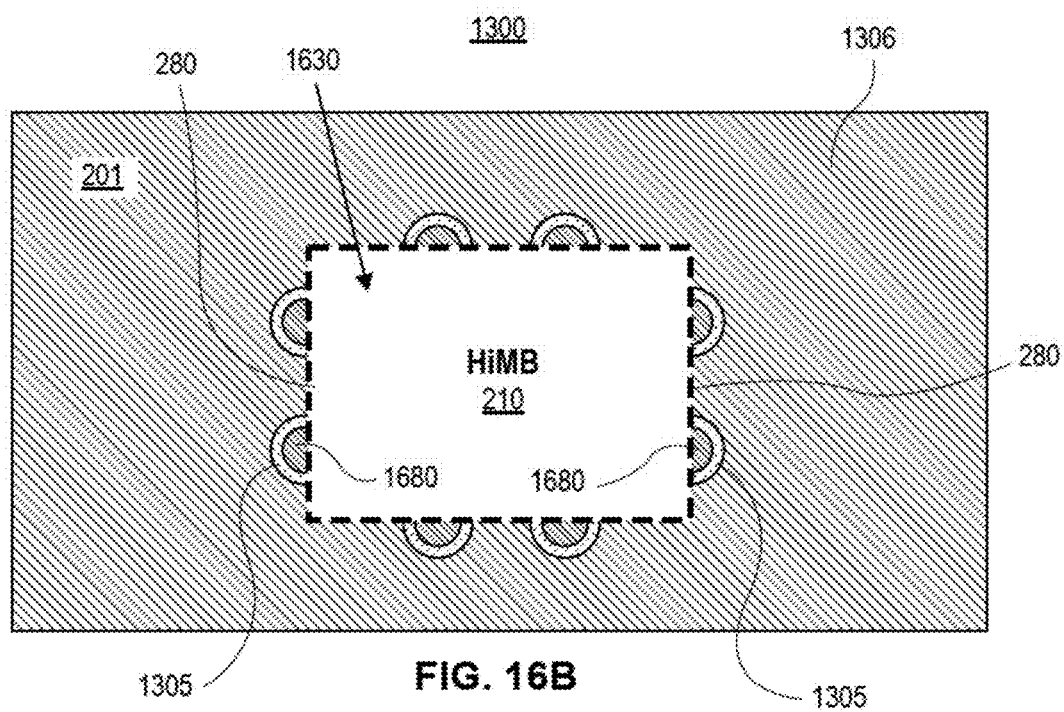

FIGS. 15B and 16B are top view illustrations of a method of forming a HiMB with one or more sidewalls in a motherboard for a semiconductor package. FIGS. 13-17 show forming sidewalls 280 of HiMB 210 of motherboard 201 in semiconductor package 1300. FIGS. 13-17 also show forming one or more PTHs (e.g., Vcc PTH or Vss PTH) along sidewalls 280 of HiMB 210 of motherboard 201 in semiconductor package 1300. Note that semiconductor package 1300 of FIGS. 13-17 is similar to semiconductor package 200 of FIGS. 2A-2B and semiconductor package 300 of FIGS. 3-9. However, different features will be mainly described, while similar features will be omitted or briefly described.

Figure 13:
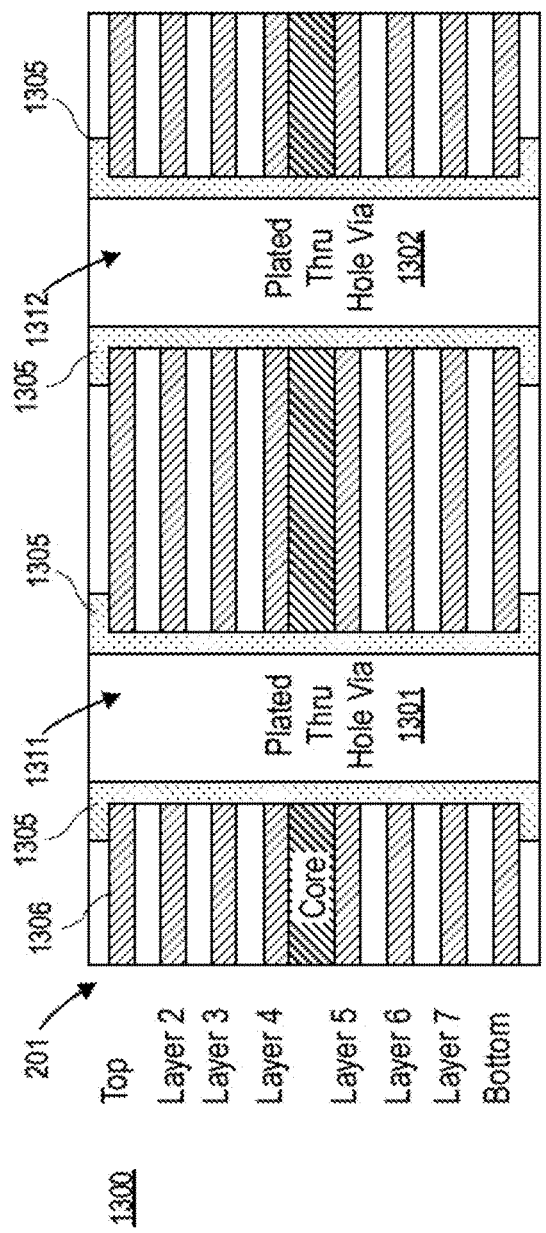

Referring now to FIG. 13. For one embodiment, semiconductor package 1300 has motherboard 201 that may include multiple layers used to form a build-up structure. For example, motherboard 201 has eight layers and each layer is formed over the next layer, starting with top layer 1306.

Motherboard 201 may have one or more PTHs 1305 that are formed on motherboard 201 based on the shape of the HiMB that is needed (as shown in FIGS. 15B and 16B). PTHs 1305 are formed with a drilling process, a laser process, or any other processes known in the art.

For one embodiment, each PTH 1305 may have a via opening (e.g., via openings 1311-1312) and a PTH via (e.g., PTH vias 1301-1302), where each PTH via may be routed through each layer of motherboard 201.

FIG. 14 shows a conductive material deposited into via openings 1311-1312 of PTHs 1305 to form filled PTH vias 1401-1402 of motherboard 201. For one embodiment, the conductive material may be a metal material, a conductive material, or the like. For one embodiment, filler PTH vias 1401-1402 may be formed with a copper electroplating (or electroless plating) process, or the like. Note that filled PTH vias 1401-1402 may be used to form a Vcc PTH, a Vss PTH, or any similar PTH.

FIGS. 15A-B show the formation of HiMB region 1550 in motherboard 201 using a laser ablation/drilling 1500 process, or any other processes known in the art. The laser/drilling process may include a router bit 1500 (or the like) that is used to form HiMB 210. To form HiMB 210 according to one embodiment, router bit 1500 lasers (or drills) along the outer edges of HiMB region 1550 (as shown with broken lines in FIGS. 15A-B), which includes lasering/drilling through each of the one or more PTHs 1305.

FIGS. 16A-B show HiMB 210 formed with sidewalls 280 and HiMB opening 1630. According to some embodiments, each sidewall 280 of HiMB 210 has one or more PTHs 1305 that are exposed as shown in FIGS. 16A-B. For example, each of the PTHs 1305 has an exposed copper layer (or wall) that is formed along the top layer 1306 to the bottom layer of motherboard 201. For some embodiments, a desmear process may be used to remove any residue along each sidewall 280 of HiMB 210. For example, the desmear process may include a plasma etch, a mechanical grinding process, a mechanical polishing process, a chemical mechanical polishing process, or the like.

Figure 17:
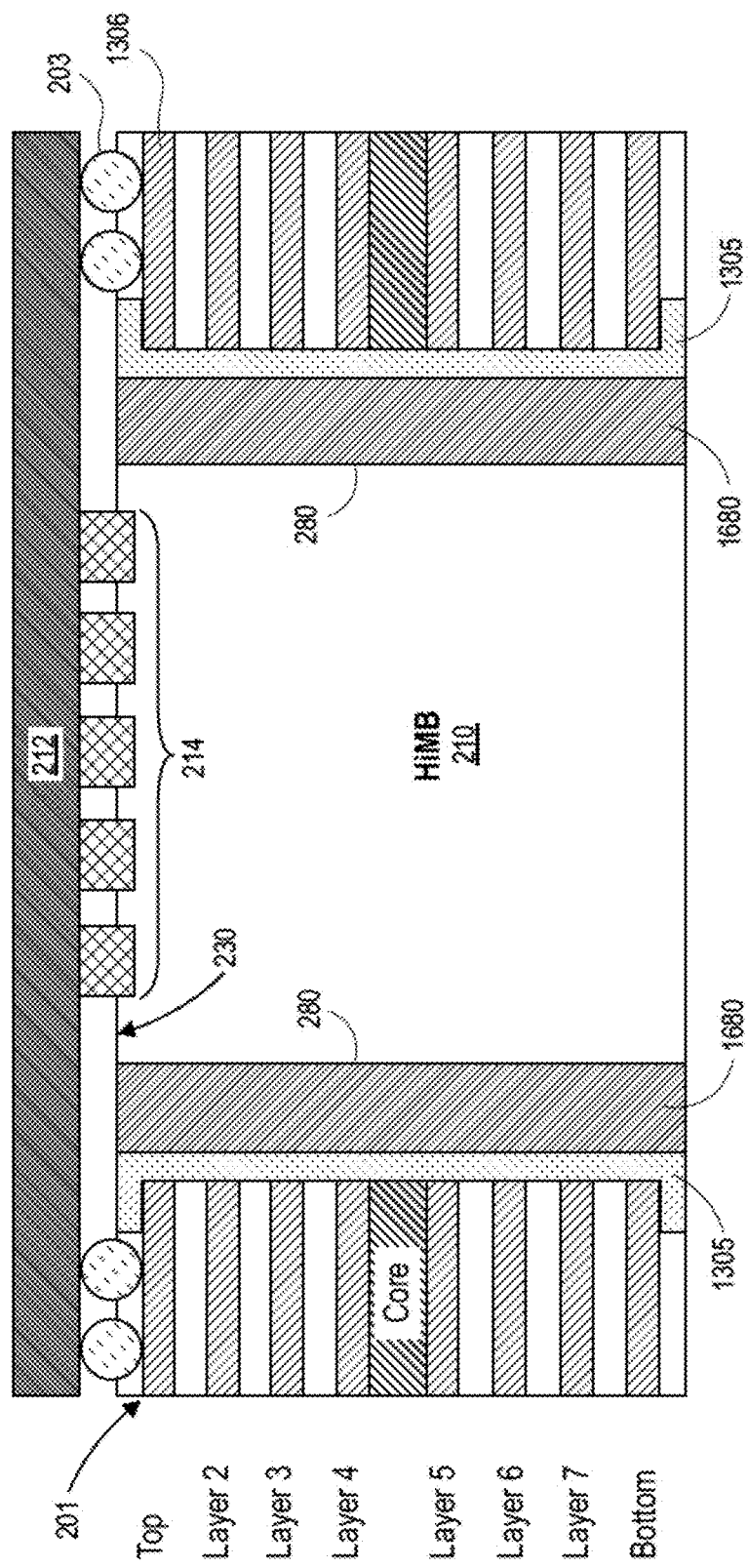

FIG. 17 shows foundation layer 212 mounted on top layer 1306 of motherboard 201. Foundation layer 212 may include one or more LSCs 214 that are located on LSC cavity 230 and within HiMB 210. As described above, filled PTH vias 1401-1402 of PTHs 1305 may include Vcc PTHs and Vss PTHs (not shown) that are formed along each sidewall 280 of HiMB 210 to vertically couple one or more 3D capacitors (e.g., 3D capacitors 251-254 of FIGS. 18-19). Note that foundation layer 212 may be mounted to motherboard 201 either before or after the EMI shield (e.g., EMI shield 250 of FIG. 2A) has been embedded with HiMB 210 of motherboard 201. Also note that semiconductor package 1300 may include fewer or additional packaging components based on the desired packaging design.

FIGS. 18A-C illustrate semiconductor package 1800 that includes motherboard 201, HiMB 210, 3D capacitors 251-254, and EMI shield 250. Note that semiconductor package 1800 of FIGS. 18A-C is similar to semiconductor package 200 of FIGS. 2A-2B, semiconductor package 300 of FIGS. 3-9, and semiconductor package 1300 of FIGS. 13-17.

Semiconductor package 1800 includes 3D capacitors 251-254 embedded vertically between sidewalls 680 of EMI shield 250 and sidewalls 280 of HiMB 210 of motherboard 201. As shown in FIGS. 18A and 18C, top layer 1306 of motherboard 201 has one or more BGA pads 1803 that may be used to mount a semiconductor die (e.g., semiconductor die 204 of FIGS. 2A-B) using solder balls/bumps (e.g., solder balls 203 of FIGS. 2A-B). Motherboard 201 has Vcc PTHs 1801 and Vss PTHs 1802 formed on each sidewall 280 of HiMB 201. For example, as shown in FIG. 18C with a close-up view, each 3D capacitor 251-254 is coupled at each terminal end to Vcc PTH 1801 and Vss PTH 1802.

FIG. 18B shows a bottom layer 1807 of motherboard 201 and EMI shield 250. For some embodiments, semiconductor package 1800 may include fewer or additional packaging components based on the desired packaging design.

FIG. 19 illustrates semiconductor package 1900 that includes motherboard 201, HiMB 210, and 3D capacitors 251-254. Note that semiconductor package 1900 of FIG. 19 is similar to semiconductor package 200 of FIGS. 2A-2B, semiconductor package 300 of FIGS. 3-9, semiconductor package 1300 of FIGS. 13-17, and semiconductor package 1800 of FIGS. 18A-C.

Semiconductor package 1900 includes 3D capacitors 251-254 embedded (or coupled/attached) vertically onto sidewalls 280 of HiMB 210 of motherboard 201. FIG. 19 shows the placement (and coupling) of 3D capacitors 251-254 without an EMI shield attached. According to some embodiments, semiconductor package 1900 may be formed with 3D capacitors 251-254 vertically embedded on the sidewalls 280 of HiMB 210—without using an EMI shield depending on its application. For some embodiments, semiconductor package 1900 may include fewer or additional packaging components based on the desired packaging design.

FIG. 20 is a process flow 2000 illustrating a method of forming an EMI shield with one or more 3D capacitors embedded into a HiMB of a motherboard in a semiconductor package. Process flow 2000 shows a method of forming a semiconductor package with an EMI shield with one or more 3D capacitors that are embedded into a HiMB of a motherboard 201, as shown in FIGS. 3-9. For one embodiment, process flow 2000 may implement a molding/compression process and a laser/drilling process as described herein. Accordingly, process flow 2000 enables 3D capacitors 251-254 to be embedded vertically within HiMB 210 and EMI shield 250 (and thus located below LSC cavity 230 of foundation layer 212), and attached vertically to Vss and Vcc PTHs that are formed on sidewalls 280 of HiMB 210 in a semiconductor package (e.g., semiconductor package 200 of FIGS. 2A-B).

At block 2005, process flow mounts one or more 3D capacitors on an electrical shield (or an EMI shield) as shown in FIGS. 4A-B. According to some embodiments, prior to mounting the one or more 3D capacitors, process flow forms an electrical shield (or an EMI shield) with one or more metal pads as shown in FIGS. 3A-B. For one embodiment, the 3D capacitors are mounted on the electrical shield with an adhesive as shown in FIG. 4A. For one embodiment, the electrical shield may have at least one or more folding edges, where each folding edge may have at least one metal pad on one of its outer edges (as shown in FIGS. 3B and 4B). For some embodiments, the 3D capacitors are mounted on the folding edges of the electrical shield as shown in FIGS. 3B and 4B.

At block 2010, process flow molds one or more sidewalls on the electrical shield with a molding jig as shown in FIGS. 5-6. For one embodiment, the electrical shield is mounted above the molding jig as shown in FIGS. 5-6. For one embodiment, process flow may apply pressure on the folding edges (or at the edges) of the electrical shield to mold/form the one or more sidewalls of the electrical shield as shown in FIGS. 3B, 4B, and 5-6. According to some embodiments, each sidewall of the electrical shield has at least one metal pad, where the metal pad is molded/formed perpendicular to the sidewall of the electrical shield (as shown in FIG. 6).

At block 2015, process flow removes the electrical shield from the molding jig as shown in FIG. 7. Note that the process flow may either remove the electrical shield from the molding jig or remove the molding jig from (under) the electrical shield. Accordingly, the 3D capacitors are now mounted vertically on the sidewalls of the electrical shield as shown in FIG. 7. At block 2020, process flow embeds the one or more sidewalls of the electrical shield into the sidewalls of a HiMB of a motherboard, where the one or more sidewalls include the 3D capacitors mounted vertically between the electrical shield and the sidewalls of the HiMB (as shown in FIGS. 8-9). For one embodiment, the motherboard has one or more ground pads as shown in FIGS. 8-9. For some embodiments, after embedding the electrical shield into the HiMB, the 3D capacitors may be electrically coupled to one or more PTHs (e.g., Vcc PTHs, Vss PTHs, etc.) that are formed on the sidewalls of the HiMB (e.g., as shown in FIG. 19). For one embodiment, the one or more ground pads of the motherboard are coupled to the metal pads of the electrical shield. Note that a spring mechanism and/or an assembly handler may be used to hold (or grip) the electrical shield in place during a reflow process (as shown in FIGS. 8-12).

Figure 21:
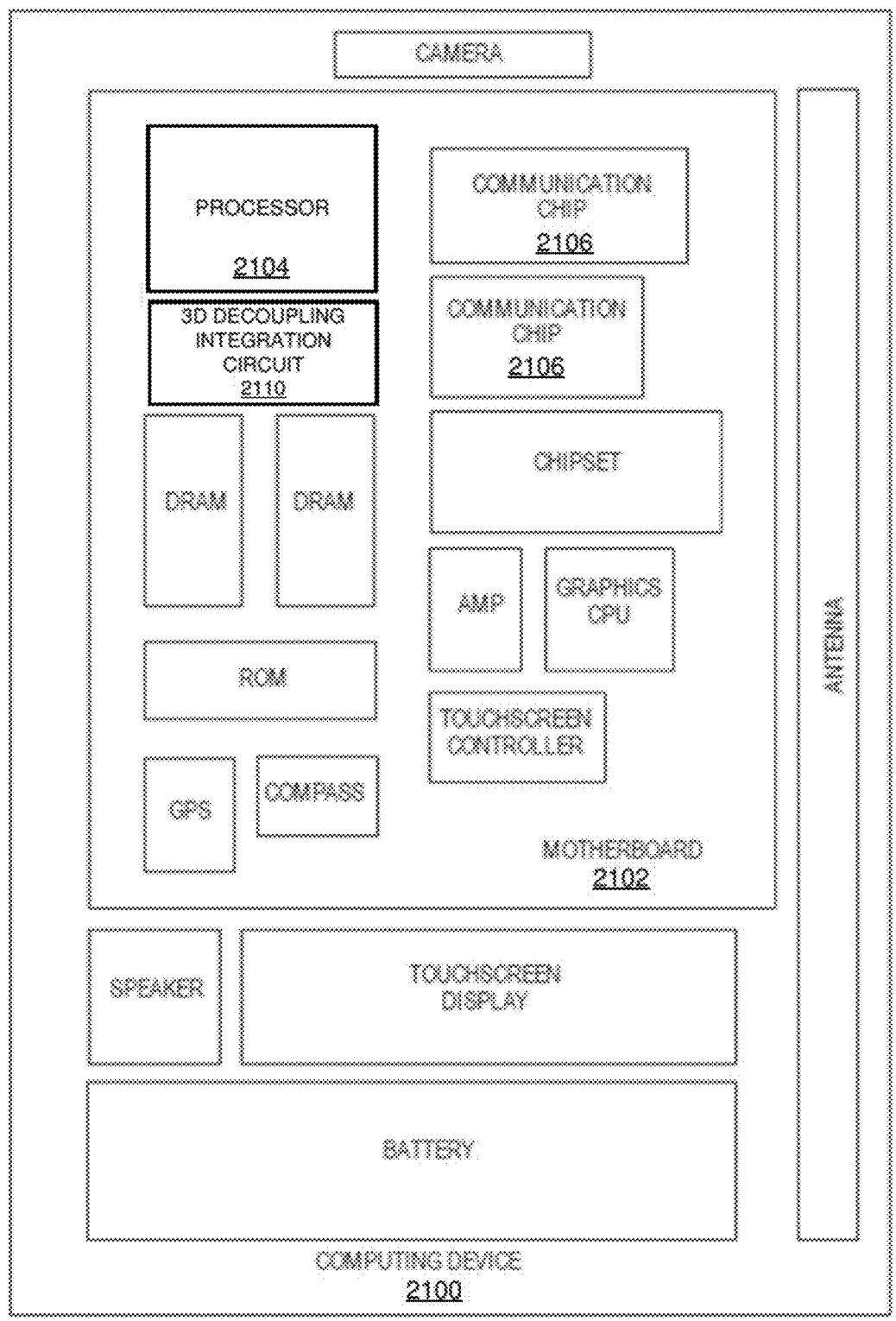
FIG. 21 is a schematic block diagram illustrating a computer system that utilizes a 3D decoupling integration circuit, according to one embodiment.

FIG. 21 illustrates an example of computing device 2100. Computing device 2100 houses motherboard 2102. For most embodiments, motherboard 2102 is similar to motherboard 201 of FIGS. 2-19. Motherboard 2102 may include a number of components, including but not limited to processor 2104, 3D decoupling integration circuit 2110, and at least one communication chip 2106. Motherboard 2102 may also be formed to implement the 3D decoupling integration process, as described herein. For example, motherboard 2102 may include similar components as shown in FIGS. 2A-B.

Processor 2104 is physically and electrically coupled to motherboard 2102. For some embodiments, at least one communication chip 2106 is also physically and electrically coupled to motherboard 2102. For other embodiments, at least one communication chip 2106 is part of processor 2104.

Depending on its applications, computing device 2100 may include other components that may or may not be physically and electrically coupled to motherboard 2102. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

At least one communication chip 2106 enables wireless communications for the transfer of data to and from computing device 2100. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. At least one communication chip 2106 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. Computing device 2100 may include a plurality of communication chips 2106. For instance, a first communication chip 2106 may be dedicated to shorter range wireless communications such as Wi-Fi and Bluetooth and a second communication chip 2106 may be dedicated to longer range wireless communications such as GPS, EDGE, GPRS, CDMA, WiMAX, LTE, Ev-DO, and others.

Processor 2104 of computing device 2100 includes an integrated circuit die (e.g., semiconductor die 204 of FIGS. 2A-B) packaged within processor 2104. 3D decoupling integration circuit 2110 may be implemented near the integrated circuit die packaged within processor 2104 to suppress EMI and RFI. For some embodiments, 3D decoupling integration circuit 2110 may be used to implement the 3D decoupling integration process, as described herein. For example, 3D decoupling integration circuit (or component) 2110 may include similar components as shown in FIGS. 2A-B.

For certain embodiments, the integrated circuit die may be packaged with one or more devices on a foundation layer (or a package substrate) that includes a thermally stable RHC and antenna for use with wireless communications and one or more of the 3D decoupling integration components, as described herein, to mitigate EMI/RFI noise and improve electrical performance. The term "processor" may refer to any device or portion of a device that processes electronic data from registers and/or memory to transform that electronic data into other electronic data that may be stored in registers and/or memory.

At least one communication chip 2106 also includes an integrated circuit die packaged within the communication chip 2106. For some embodiments, the integrated circuit die of the communication chip may be packaged with one or more devices on a foundation layer (or a package substrate) that includes one or more of the 3D decoupling integration components, as described herein, to mitigate EMI/RFI noise and improve electrical performance.

In the foregoing specification, embodiments have been described with reference to specific exemplary embodiments thereof. It should be borne in mind, however, that all of these and similar terms are to be associated with the appropriate physical quantities and are merely convenient labels applied to these quantities. It will be evident that various modifications may be made thereto without departing from the broader spirit and scope. The specification and drawings are, accordingly, to be regarded in an illustrative sense rather than a restrictive sense.

The following examples pertain to further embodiments. The various features of the different embodiments may be variously combined with some features included and others excluded to suit a variety of different applications.

The following examples pertain to further embodiments:

For some embodiments, a semiconductor package includes a foundation layer mounted on a motherboard; a hole in motherboard (HiMB) formed in the motherboard; and one or more capacitors mounted on an electrical shield, the electrical shield embedded in the HiMB of the motherboard, wherein the one or more capacitors are vertically embedded between the electrical shield and the HiMB of the motherboard.

For one embodiment, the semiconductor package further comprising: an adhesive mounted between the electrical shield and the one or more capacitors; and one or more ground pads mounted on the motherboard.

For one embodiment of the semiconductor, wherein the electrical shield includes at least one or more metal pads and one or more electrical shield sidewalls, and wherein the one or more metal pads of the electrical shield are coupled with the one or more ground pads of the motherboard.

For one embodiment of the semiconductor, wherein each electrical shield sidewall is attached and perpendicular to at least one of the one or more metal pads.

For one embodiment, the semiconductor package further comprising: a land-side cavity formed on the foundation layer, wherein the land-side cavity resides underneath the foundation layer; and one or more land-side capacitors (LSCs) mounted on the land-side cavity of the foundation layer, wherein the one or more LSCs are mounted above the HiMB of the motherboard and the electrical shield.

For one embodiment of the semiconductor, wherein the HiMB of the motherboard resides below the land-side cavity and the LSCs of the foundation layer.

For one embodiment, the semiconductor package further comprising one or more HiMB sidewalls formed on the HiMB of the motherboard, wherein each of the one or more HiMB sidewalls includes at least one or more plated through holes (PTHs), and wherein each of the one or more PTHs includes an exposed layer.

For one embodiment of the semiconductor, wherein the one or more PTHs are electrically coupled to the one or more capacitors when the one or more capacitors are vertically embedded between the electrical shield sidewalls and the HiMB sidewalls.

For one embodiment, the semiconductor package further comprising: a semiconductor die mounted above the foundation layer and the HiMB of the motherboard, and wherein the foundation layer is attached to the motherboard with a plurality of solder balls.

For one embodiment, the semiconductor package further comprising at least one of a spring mechanism, an assembly handler, and a molding jig.

For some embodiments, a method of forming a semiconductor package, comprising: mounting one or more capacitors on an electrical shield; molding one or more electrical shield sidewalls on the electrical shield, wherein each electrical shield sidewall includes at least one or more metal pads; removing the electrical shield, wherein each electrical shield sidewall is molded perpendicular to the metal pad; and embedding the one or more electrical shield sidewalls of the electrical shield in a HiMB formed in a motherboard, wherein the one or more capacitors are vertically mounted between the one or more electrical shield sidewalls of the electrical shield and the HiMB of the motherboard.

For one embodiment, the method further comprising forming the electrical shield to have at least one or more folding edges prior to mounting the one or more capacitors.

For one embodiment of the method, wherein molding the one or more electrical shield sidewalls further comprises mounting the electrical shield above a molding jig, and applying pressure at least on the one or more folding edges of the electrical shield to mold the one or more electric shield sidewalls using the molding jig.

For one embodiment, the method further comprising: mounting an adhesive between the electrical shield and the one or more capacitors; mounting a foundation layer on the motherboard; and mounting one or more ground pads on the motherboard.

For one embodiment of the method, wherein the one or more metal pads of the electrical shield are coupled with the one or more ground pads of the motherboard.

For one embodiment, the method further comprising: forming a land-side cavity on the foundation layer, wherein the land-side cavity resides underneath the foundation layer; and mounting one or more land-side capacitors (LSCs) on the land-side cavity of the foundation layer, wherein the one or more LSCs are mounted above the HiMB of the motherboard and the electrical shield.

For one embodiment of the method, wherein the HiMB of the motherboard resides below the land-side cavity and the LSCs of the foundation layer.

For one embodiment, the method further comprising forming one or more HiMB sidewalls on the HiMB of the motherboard, wherein each of the one or more HiMB sidewalls includes at least one or more plated through holes (PTHs), and wherein each of the one or more PTHs includes an exposed layer.

For one embodiment of the method, wherein the one or more PTHs are electrically coupled to the one or more capacitors when the one or more capacitors are vertically embedded between the electrical shield sidewalls and the HiMB sidewalls.

For one embodiment, the method further comprising mounting a semiconductor die above the foundation layer and the HiMB of the motherboard; and mounting the foundation layer to the motherboard with a plurality of solder balls.

For one embodiment, the method further comprising at least one of a spring mechanism, and an assembly handler.

For some embodiments, a semiconductor package, comprising: a foundation layer mounted on a motherboard; a hole in motherboard (HiMB) formed in the motherboard; and one or more capacitors mounted on the HiMB, wherein the one or more capacitors are vertically embedded in the HiMB of the motherboard.

For one embodiment, the semiconductor package further comprising: an electrical shield embedded in the HiMB of the motherboard, wherein the one or more capacitors are vertically embedded between the electrical shield and the HiMB of the motherboard; an adhesive mounted between the electrical shield and the one or more capacitors; one or more ground pads mounted on the motherboard; a semiconductor die mounted above the foundation layer and the HiMB of the motherboard, wherein the foundation layer is attached to the motherboard with a plurality of solder balls; and one or more HiMB sidewalls formed on the HiMB of the motherboard, each of the one or more HiMB sidewalls includes at least one or more plated through holes (PTHs), wherein each of the one or more PTHs includes an exposed layer.

For one embodiment of the method, wherein the electrical shield includes at least one or more metal pads and one or more electrical shield sidewalls, wherein the one or more metal pads of the electrical shield are coupled with the one or more ground pads of the motherboard, wherein each electrical shield sidewall is attached and perpendicular to at least one of the one or more metal pads, and wherein each of the one or more PTHs is electrically coupled to the one or more capacitors when the one or more capacitors are vertically embedded between the electrical shield sidewalls and the HiMB sidewalls For one embodiment, the semiconductor package further comprising: a land-side cavity formed on the foundation layer, wherein the land-side cavity resides underneath the foundation layer; and one or more land-side capacitors (LSCs) mounted on the land-side cavity of the foundation layer, the one or more LSCs are mounted above the HiMB of the motherboard and the electrical shield, wherein the HiMB of the motherboard resides below the land-side cavity and the LSCs of the foundation layer.

In the foregoing specification, methods and apparatuses have been described with reference to specific exemplary embodiments thereof. It will be evident that various modifications may be made thereto without departing from the broader spirit and scope. The specification and drawings are, accordingly, to be regarded in an illustrative sense rather than a restrictive sense.

What is claimed is:

1. A semiconductor package, comprising:
   a foundation layer mounted on a motherboard;
   a hole in motherboard (HiMB) formed in the motherboard; and
   one or more capacitors mounted on an electrical shield, the electrical shield embedded in the HiMB of the motherboard, wherein the one or more capacitors are vertically embedded between the electrical shield and the HiMB of the motherboard.

2. The semiconductor package of claim 1, further comprising:
   an adhesive mounted between the electrical shield and the one or more capacitors; and
   one or more ground pads mounted on the motherboard.

3. The semiconductor package of claim 2, wherein the electrical shield includes at least one or more metal pads and one or more electrical shield sidewalls, and wherein the one or more metal pads of the electrical shield are coupled with the one or more ground pads of the motherboard.

4. The semiconductor package of claim 3, wherein each electrical shield sidewall is attached and perpendicular to at least one of the one or more metal pads.

5. The semiconductor package of claim 1, further comprising:
   a land-side cavity formed on the foundation layer, wherein the land-side cavity resides underneath the foundation layer; and
   one or more land-side capacitors (LSCs) mounted on the land-side cavity of the foundation layer, wherein the one or more LSCs are mounted above the HiMB of the motherboard and the electrical shield.

6. The semiconductor package of claim 5, wherein the HiMB of the motherboard resides below the land-side cavity and the LSCs of the foundation layer.

7. The semiconductor package of claim 1, further comprising one or more HiMB sidewalls formed on the HiMB of the motherboard, wherein each of the one or more HiMB sidewalls includes at least one or more plated through holes (PTHs), and wherein each of the one or more PTHs includes an exposed layer.

8. The semiconductor package of claim 7, wherein the one or more PTHs are electrically coupled to the one or more capacitors when the one or more capacitors are vertically embedded between sidewalls of the electrical shield and the HiMB sidewalls.

9. The semiconductor package of claim 1, further comprising a semiconductor die mounted above the foundation layer and the HiMB of the motherboard, and wherein the foundation layer is attached to the motherboard with a plurality of solder balls.

10. The semiconductor package of claim 1, further comprising at least one of a spring mechanism, an assembly handler, and a molding jig.

11. A method of forming a semiconductor package, comprising:
    mounting one or more capacitors on an electrical shield;
    molding one or more electrical shield sidewalls on the electrical shield, wherein each electrical shield sidewall includes at least one or more metal pads;
    removing the electrical shield, wherein each electrical shield sidewall is molded perpendicular to the metal pad; and
    embedding the one or more electrical shield sidewalls of the electrical shield in a HiMB formed in a motherboard, wherein the one or more capacitors are vertically mounted between the one or more electrical shield sidewalls of the electrical shield and the HiMB of the motherboard.

12. The method of claim 11, further comprising forming the electrical shield to have at least one or more folding edges prior to mounting the one or more capacitors.

13. The method of claim 12, wherein molding the one or more electrical shield sidewalls further comprises mounting the electrical shield above a molding jig, and applying pressure at least on the one or more folding edges of the electrical shield to mold the one or more electric shield sidewalls using the molding jig.

14. The method of claim 11, further comprising:
    mounting an adhesive between the electrical shield and the one or more capacitors;
    mounting a foundation layer on the motherboard; and
    mounting one or more ground pads on the motherboard.

15. The method of claim 14, wherein the one or more metal pads of the electrical shield are coupled with the one or more ground pads of the motherboard.

16. The method of claim 14, further comprising:
    forming a land-side cavity on the foundation layer, wherein the land-side cavity resides underneath the foundation layer; and
    mounting one or more land-side capacitors (LSCs) on the land-side cavity of the foundation layer, wherein the one or more LSCs are mounted above the HiMB of the motherboard and the electrical shield.

17. The method of claim 16, wherein the HiMB of the motherboard resides below the land-side cavity and the LSCs of the foundation layer.

18. The method of claim 14, further comprising mounting a semiconductor die above the foundation layer and the HiMB of the motherboard; and
    mounting the foundation layer to the motherboard with a plurality of solder balls.

19. The method of claim 11, further comprising forming one or more HiMB sidewalls on the HiMB of the motherboard, wherein each of the one or more HiMB sidewalls includes at least one or more plated through holes (PTHs), and wherein each of the one or more PTHs includes an exposed layer.

20. The method of claim 19, wherein the one or more PTHs are electrically coupled to the one or more capacitors when the one or more capacitors are vertically embedded between the electrical shield sidewalls and the HiMB sidewalls.

21. The method of claim 11, further comprising at least one of a spring mechanism, and an assembly handler.

22. A semiconductor package, comprising:
a foundation layer mounted on a motherboard;
a hole in motherboard (HiMB) formed in the motherboard;
one or more capacitors in the HiMB; and
an electrical shield in the HiMB.

23. The semiconductor package of claim 22, further comprising:
wherein the one or more capacitors are vertically embedded between the electrical shield and the HiMB of the motherboard;
an adhesive mounted between the electrical shield and the one or more capacitors;
one or more ground pads mounted on the motherboard;
a semiconductor die mounted above the foundation layer and the HiMB of the motherboard, wherein the foundation layer is attached to the motherboard with a plurality of solder balls; and
one or more HiMB sidewalls formed on the HiMB of the motherboard, each of the one or more HiMB sidewalls includes at least one or more plated through holes (PTHs), wherein each of the one or more PTHs includes an exposed layer.

24. The semiconductor package of claim 23, wherein the electrical shield includes at least one or more metal pads and one or more electrical shield sidewalls, wherein the one or more metal pads of the electrical shield are coupled with the one or more ground pads of the motherboard, wherein each electrical shield sidewall is attached and perpendicular to at least one of the one or more metal pads, and wherein each of the one or more PTHs is electrically coupled to the one or more capacitors when the one or more capacitors are vertically embedded between the electrical shield sidewalls and the HiMB sidewalls.

25. The semiconductor package of claim 22, further comprising:
a land-side cavity formed on the foundation layer, wherein the land-side cavity resides underneath the foundation layer; and
one or more land-side capacitors (LSCs) mounted on the land-side cavity of the foundation layer, the one or more LSCs are mounted above the HiMB of the motherboard and the electrical shield, wherein the HiMB of the motherboard resides below the land-side cavity and the LSCs of the foundation layer.

* * * * *